US010199422B2

(12) United States Patent
Araki

(10) Patent No.: US 10,199,422 B2
(45) Date of Patent: Feb. 5, 2019

(54) SEMICONDUCTOR DEVICE

(71) Applicant: Renesas Electronics Corporation, Tokyo (JP)

(72) Inventor: Yasuhiro Araki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/317,094

(22) PCT Filed: Jul. 9, 2014

(86) PCT No.: PCT/JP2014/068288
§ 371 (c)(1),
(2) Date: Dec. 7, 2016

(87) PCT Pub. No.: WO2016/006052
PCT Pub. Date: Jan. 14, 2016

(65) Prior Publication Data
US 2017/0110499 A1    Apr. 20, 2017

(51) Int. Cl.
*H01L 27/146* (2006.01)
*H04N 5/374* (2011.01)
*H04N 5/3745* (2011.01)

(52) U.S. Cl.
CPC .. *H01L 27/14643* (2013.01); *H01L 27/14605* (2013.01); *H01L 27/14612* (2013.01);
(Continued)

(58) Field of Classification Search
CPC ......... H01L 27/14643; H01L 27/14612; H01L 27/14623; H01L 27/14641;
(Continued)

(56) References Cited

U.S. PATENT DOCUMENTS 8,441,565 B2 * 5/2013 Suzuki ............ H01L 27/14609
348/230.1
8,964,084 B2 2/2015 Yamashita
(Continued)

FOREIGN PATENT DOCUMENTS

JP          07058314 A   *  3/1995   ........... H01L 29/762
JP       2010-212769 A      9/2010
(Continued)

OTHER PUBLICATIONS

International Search Report (ISR) (PCT Form PCT/ISA/210), in PCT/JP2014/068288, dated Sep. 16, 2014.
(Continued)

*Primary Examiner* — Latanya N Crawford
(74) *Attorney, Agent, or Firm* — McGinn I.P. Law Group, PLLC.

(57) ABSTRACT

A plurality of pixel regions are aligned in a matrix in a semiconductor substrate, and each of the plurality of pixel regions includes an active region, two photoelectric conversion elements, two floating capacitance regions, and a first transistor. Each of the plurality of pixel regions includes two transfer transistors each having each of the two photoelectric conversion elements and each of the two floating capacitance regions. The first transistor is arranged within the pixel region, between one floating capacitance region and the other floating capacitance region of the two floating capacitance regions with respect to a direction in which the one floating capacitance region and the other floating capacitance region are aligned.

19 Claims, 31 Drawing Sheets

(52) U.S. Cl.
CPC .. *H01L 27/14623* (2013.01); *H01L 27/14636* (2013.01); *H01L 27/14641* (2013.01); *H01L 27/14689* (2013.01); *H04N 5/374* (2013.01); *H04N 5/37457* (2013.01)

(58) Field of Classification Search
CPC ......... H01L 27/14636; H01L 27/14689; H01L 27/14605; H04N 5/37457; H04N 5/374
See application file for complete search history.

(56) References Cited

U.S. PATENT DOCUMENTS

| | | |
|---|---|---|
| 9,445,024 B2 | 9/2016 | Yamashita |
| 9,620,558 B2 * | 4/2017 | Suzuki ............... H01L 27/14603 |
| 2010/0225795 A1 * | 9/2010 | Suzuki ............... H01L 27/14609 |
| | | 348/300 |
| 2013/0194471 A1 | 8/2013 | Yamashita |
| 2015/0109499 A1 | 4/2015 | Yamashita |
| 2015/0123173 A1 * | 5/2015 | He ................... H01L 27/14634 |
| | | 257/231 |

FOREIGN PATENT DOCUMENTS

| | | |
|---|---|---|
| JP | 2013-157883 A | 8/2013 |
| WO | WO 2014/061820 A1 | 4/2014 |

OTHER PUBLICATIONS

Japanese Office Action, dated Mar. 13, 2018, in Japanese Application No. 2016-532832 and English Translation thereof.
Taiwanese Office Action, dated Jul. 25, 2018, in Taiwanese Application No. 104113381 and English Translation thereof.

\* cited by examiner

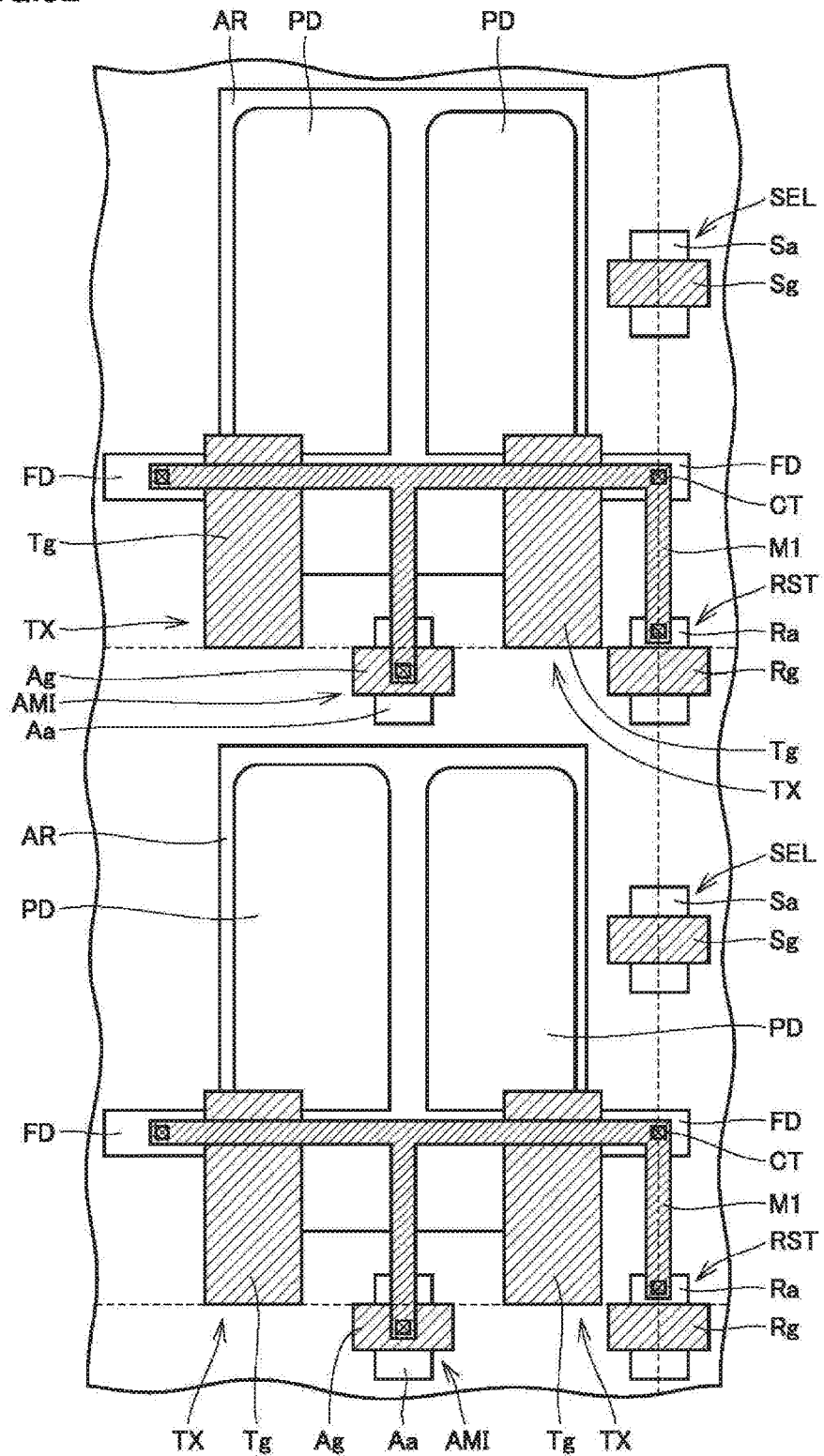

SEMICONDUCTOR DEVICE

TECHNICAL FIELD

The present invention relates to a semiconductor device, and in particular to a semiconductor device including pixel regions each having two photoelectric conversion elements within one active region.

BACKGROUND ART

In a semiconductor device having a conventional solid-state imaging element, the solid-state imaging element has a configuration having one photoelectric conversion element arranged within one pixel region, as described for example in Japanese Patent Laying-Open No. 2013-157883 (PTD 1). As described in PTD 1, in the solid-state imaging element, substantially half of a light incident region in which light is incident on the photoelectric conversion element is shielded by a light shielding film made of a metal or the like. By shielding half of the region, focus adjustment and the like can be performed in the field of vision of one eye of a user.

CITATION LIST

Patent Document

PTD 1: Japanese Patent Laying-Open No. 2013-157883

SUMMARY OF INVENTION

Technical Problem

The solid-state imaging element in PTD 1 has a problem that it can process only a small amount of signals at one time, because a portion of the incident light is shielded by the light shielding film. Consequently, in recent years, a solid-state imaging element having two photoelectric conversion elements arranged within one pixel region is under development. When this photoelectric conversion element is used, the amount of signals which can be processed at one time is substantially twice that of the solid-state imaging element in PTD 1, and thus focus adjustment and the like can be performed by one pixel region at a higher speed.

However, in this solid-state imaging element capable of performing a high-speed operation, generally, another transistor which receives an electric signal output from each of the two photoelectric conversion elements within one pixel region is arranged in a region away from the photoelectric conversion element. Accordingly, a wire which connects each photoelectric conversion element and the other transistor may have an unreasonably long length. The inventor of the present invention has focused attention on the possibility that such an increase in the length of a wire may cause a problem that the wire has an increased wire capacitance value.

Other problems and novel features will become apparent from the description of the present specification and the accompanying drawings.

Solution to Problem

A semiconductor device in accordance with one embodiment is a semiconductor device having a plurality of pixel regions aligned in a matrix in a semiconductor substrate. Each of the plurality of pixel regions includes an active region, two photoelectric conversion elements, two floating capacitance regions, and a first transistor. The two photoelectric conversion elements are arranged within the active region to be spaced from each other. The two floating capacitance regions can each constitute a transfer transistor for transferring electrons obtained by photoelectric conversion, together with each of the two photoelectric conversion elements, and takes out and accumulates an electric signal output from the photoelectric conversion element. The first transistor receives an electric signal output from the transfer transistor. Each of the plurality of pixel regions includes two transfer transistors each having each of the two photoelectric conversion elements and each of the two floating capacitance regions. The first transistor is arranged within the pixel region, between one floating capacitance region and the other floating capacitance region of the two floating capacitance regions with respect to a direction in which the one floating capacitance region and the other floating capacitance region are aligned.

Advantageous Effects of Invention

According to one embodiment, a wire which connects each photoelectric conversion element and the first transistor can have a shortened length, and can have a reduced wire capacitance value.

BRIEF DESCRIPTION OF DRAWINGS

FIG. 32 is an enlarged schematic plan view showing a configuration of a pixel portion in a fifth embodiment.

DESCRIPTION OF EMBODIMENTS

Hereinafter, one embodiment will be described based on the drawings.

(First Embodiment)

First, arrangement of element formation regions of a semiconductor device of one embodiment in a main surface of a semiconductor substrate will be described with reference to FIGS. 1 to 2.

Figure 1:
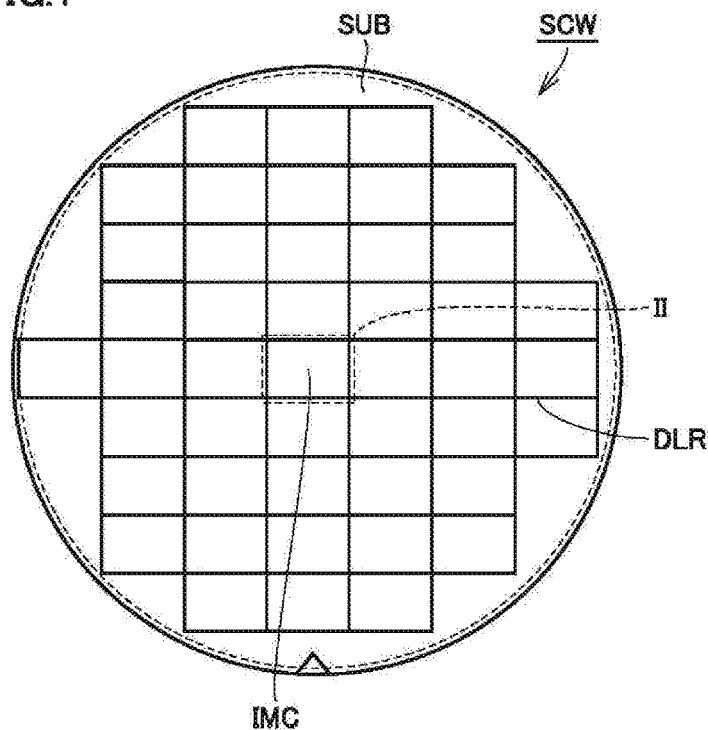
FIG. 1 is a schematic plan view showing a semiconductor device in the state of a wafer in accordance with one embodiment.

Referring to FIG. 1, a semiconductor device is formed in a semiconductor wafer SCW including a semiconductor substrate SUB as a base. A plurality of chip regions IMC for CMOS sensors are formed in semiconductor wafer SCW. The plurality of chip regions IMC each have a rectangular planar shape, and are arranged in a matrix. In addition, a dicing line region DLR is formed between the plurality of chip regions IMC.

Figure 2:
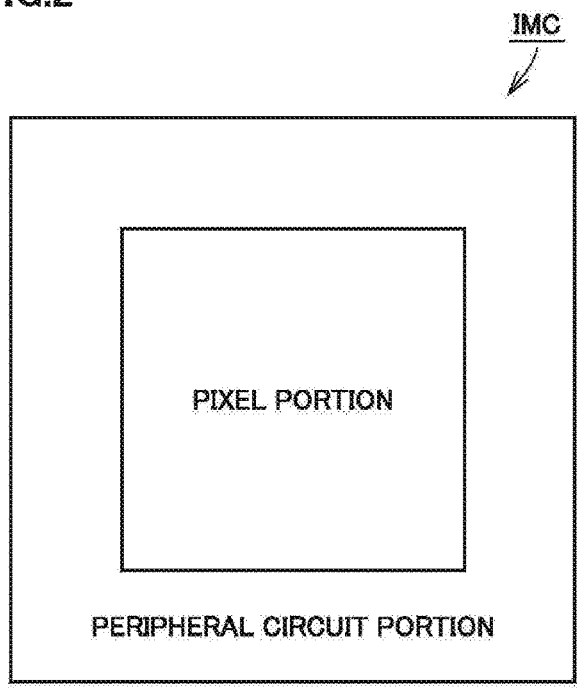
FIG. 2 is a schematic view of a region II surrounded by a dotted line in FIG. 1.

Referring to FIG. 2, each chip region IMC has a pixel portion and a peripheral circuit portion. The pixel portion is formed in a central portion of chip region IMC, and the peripheral circuit portion is formed in a region which surrounds the periphery of the pixel portion.

Figure 3:
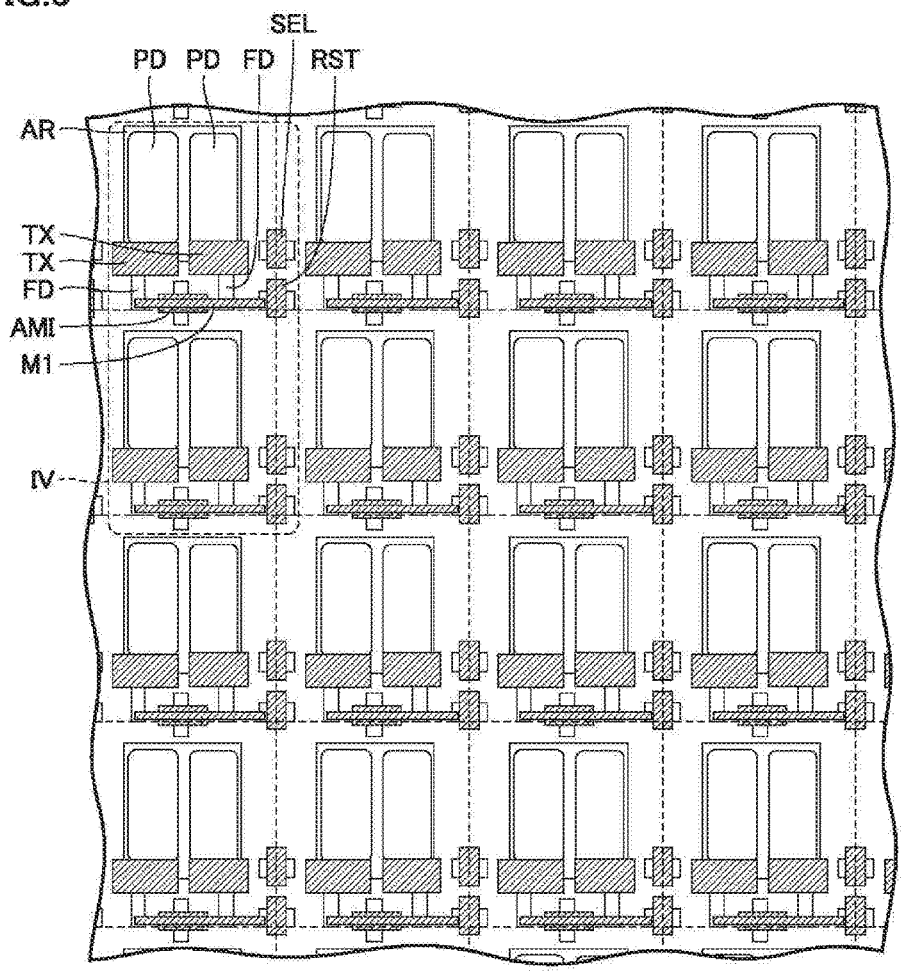
FIG. 3 is a schematic plan view showing a first example of a configuration of a pixel portion of a semiconductor device in a first embodiment.
Figure 4:
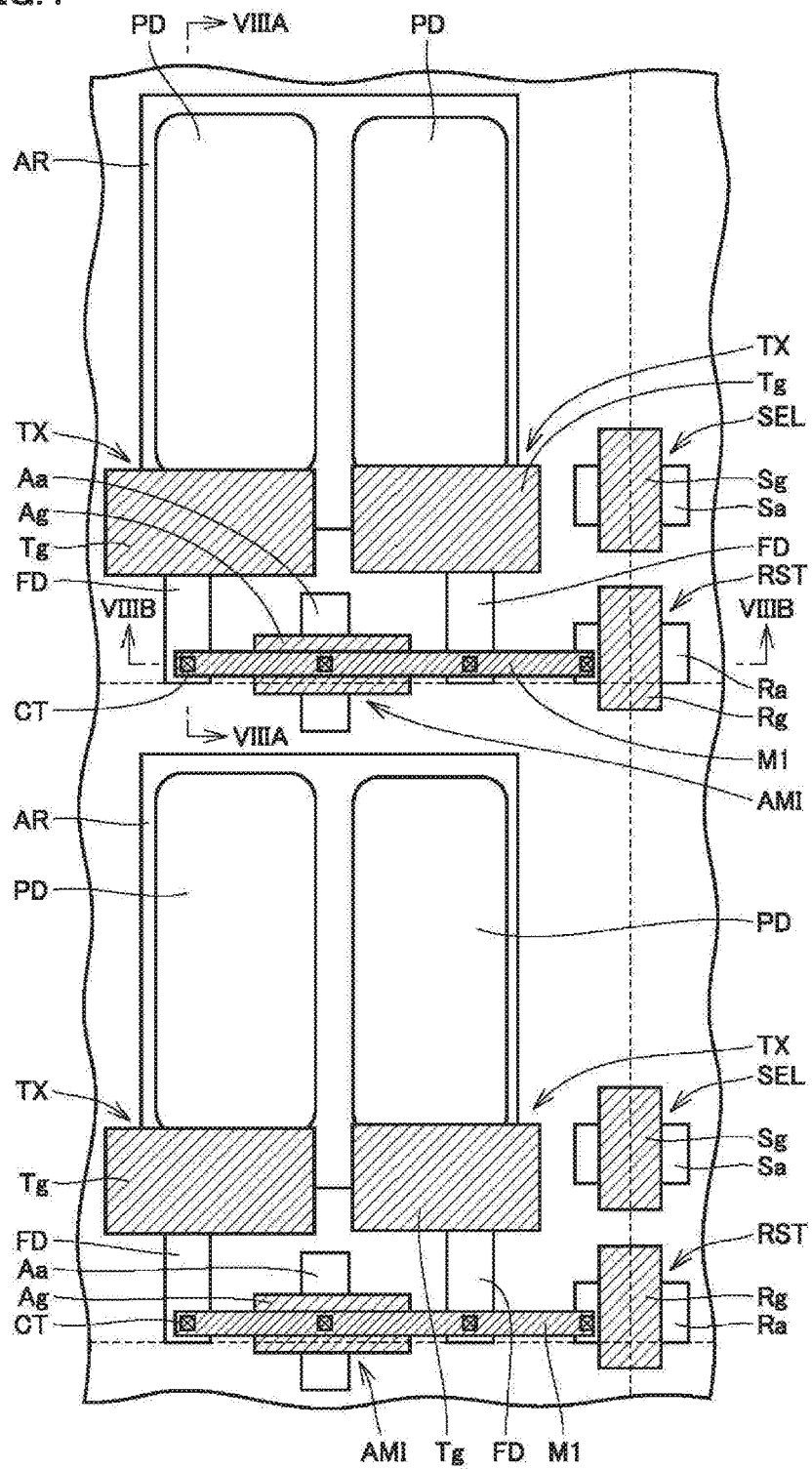
FIG. 4 is an enlarged schematic plan view of a region IV surrounded by a dotted line in FIG. 3.

Referring to FIGS. 3 and 4, in a first example of the present embodiment, in the pixel portion in FIG. 2, a plurality of pixel regions each mainly having, and constituted by, photodiodes PD, transfer transistors TX, an amplification transistor AMI, a reset transistor RST, and a selection transistor SEL are arranged in a matrix. Namely, a rectangular (or square) region defined by a dotted line in FIG. 3 corresponds to a pixel region.

It should be noted that, although portions of reset transistor RST and the like are placed to overlap on a boundary portion of each pixel region defined by the dotted line in FIG. 3, this is one example, and the boundary portion of each pixel region may be provided such that, for example, all transistors are arranged within the pixel region inside the boundary portion without protruding therefrom.

In semiconductor substrate SUB serving as a base constituting each pixel region, an active region AR having, for example, a rectangular shape in a plan view is formed. Here, a pixel region is defined to mean a constitutional unit formed of one active region AR and photodiodes PD formed therein, and aforementioned transfer transistors TX, amplification transistor AMI, and reset transistor RST connected to photodiodes PD, and the like. As described above, in the pixel portion, the plurality of pixel regions are arranged in a matrix.

Active region AR is formed, for example, as a region where a conductive impurity is implanted, within semiconductor substrate SUB. Within active region AR, a plurality of, for example two photodiodes PD are arranged to be spaced from each other with respect to a right/left direction of FIG. 3, for example. Here, photodiode PD means a photoelectric conversion element which receives light and thereby can generate a charge by photoelectric conversion, and has a configuration in which a pn junction between a p type impurity region and an n type impurity region is formed within semiconductor substrate SUB as described below. It should be noted that three or more photodiodes PD may be arranged within active region AR.

Within each pixel region, a floating diffusion region FD as a region where a conductive impurity is implanted as with active region AR, for example, is formed to be spaced from each of two photodiodes PD. Floating diffusion region FD is a floating capacitance region which can take out and accumulate an electric signal output from photodiode PD (a signal of the charge obtained by the photoelectric conversion of photodiode PD). Two floating diffusion regions FD are arranged within each pixel region to allow accumulation of the electric signals from two photodiodes PD.

A transfer gate electrode Tg is arranged between photodiode PD and floating diffusion region FD in a plan view, and photodiode PD, floating diffusion region FD, and transfer gate electrode Tg constitute transfer transistor TX. (Two) transfer gate electrodes Tg are arranged between two photodiodes PD and two floating diffusion regions FD within each pixel region. Accordingly, two transfer transistors TX constituted by two photodiodes PD, two floating diffusion regions FD, and two transfer gate electrodes Tg, respectively, are arranged within each pixel region.

In FIGS. 3 and 4, photodiode PD and floating diffusion region FD each have a planar shape extending in an up/down direction of the drawing, and photodiode PD and floating diffusion region FD are arranged to be substantially aligned on a straight line (with transfer gate electrode Tg being interposed therebetween) with respect to the up/down direction of the drawing. Further, transfer gate electrode Tg has a planar shape extending in the right/left direction of the drawing to intersect therewith. However, each of the planar shapes described above is one example, and the planar shape is not limited thereto.

Transfer transistor TX is constituted by photodiode PD, floating diffusion region FD, and transfer gate electrode Tg. Within transfer transistor TX, photodiode PD serves as a source region of a field effect transistor which supplies a charge, floating diffusion region FD serves as a drain region which receives and accumulates a charge, and supplies the charge to another transistor or the like, and transfer gate electrode Tg serves as a gate electrode. Accordingly, it is preferable that transfer gate electrode Tg partially overlaps with photodiode PD and floating diffusion region FD adjacent thereto.

Within each pixel region, transfer transistor TX described above transfers the charge from photodiode PD to amplification transistor AMI, reset transistor RST, and selection transistor SEL, which are other transistors arranged on the outside of transfer transistor TX within the pixel region, through a wire M1 and the like in the drawing, for example.

Amplification transistor AMI is a type of a field effect transistor having an amplification active region Aa as a source/drain region and an amplification gate electrode Ag as a gate electrode. Similarly, reset transistor RST is a type of a field effect transistor having a reset active region Ra as a source/drain region and a reset gate electrode Rg as a gate electrode, and the selection transistor is a type of a field effect transistor having a selection active region Sa as a source/drain region and a selection gate electrode Sg as a gate electrode.

Amplification transistor AMI is a field effect transistor for amplifying a signal charge obtained by the photoelectric conversion of photodiode PD. Reset transistor RST is a field effect transistor for periodically resetting a charge accumulated in a node connected to the floating diffusion region of transfer transistor TX, by applying a voltage to a row reset line to attain an ON state. Further, selection transistor SEL is a field effect transistor for selecting any one of row selection lines to which pixels arranged in a matrix are connected, and selecting pixels connected to the one row selection line.

In FIGS. 3 and 4, two transfer transistors TX are arranged in the same direction (i.e., such that, in each of two transfer transistors TX, photodiode PD is aligned on an upper side of the drawing, and floating diffusion region FD is aligned on a lower side of the drawing). Accordingly, floating diffusion region FD of one transfer transistor TX and floating diffusion region FD of the other transfer transistor TX of two transfer transistors TX are arranged to be aligned in the right/left direction of FIG. 3 and the like. Thereby, in FIGS. 3 and 4, amplification transistor AMI as a first transistor is arranged between floating diffusion regions FD of one and the other of two transfer transistors TX within each pixel region which are aligned in the right/left direction in a plan view.

In particular, in FIGS. 3 and 4, each of two floating diffusion regions FD and amplification transistor AMI as the first transistor therebetween are aligned in a straight line in the right/left direction of the drawing in a plan view.

One amplification transistor AMI as the first transistor is arranged for each pixel region, and is shared by two transfer transistors TX arranged on both the right and left sides of the drawing. Here, "share" means that electric signals from both of two transfer transistors TX within one pixel region are transmitted to aforementioned one amplification transistor AMI arranged therebetween, and one amplification transistor AMI receives the electric signals and performs amplification processing. In other words, both of two transfer transistors TX within one pixel region share one amplification transistor AMI.

In the present embodiment, one reset transistor RST and one selection transistor SEL are arranged for each pixel region (as with amplification transistor AMI). The position at which selection transistor SEL is arranged in FIGS. 3 and 4 is merely one example, and the position is not limited thereto.

Reset transistor RST is arranged on an extension line (on the right side of FIGS. 3 and 4) of a straight line which connects two floating diffusion regions FD and amplification transistor AMI therebetween in a plan view. In other words, reset transistor RST is aligned with each of two floating diffusion regions FD on a straight line in a plan view. In addition, each of two floating diffusion regions FD described above, amplification gate electrode Ag, for example, of amplification transistor AMI therebetween, and reset active region Ra of reset transistor RST are electrically connected to wire M1 extending like a straight line in the right/left direction of the drawing, through contacts CT, for example. This allows reset transistor RST as a second transistor to receive an electric signal output from amplification transistor AMI as the first transistor.

It should be noted that, although wire M1 is shown only in a region which connects two floating diffusion regions FD in FIG. 4 for convenience of explanation, wire M1 is actually also routed in other regions, although not shown.

In FIGS. 3 and 4, amplification gate electrode Ag has a planar shape extending in the right/left direction of the drawing (as with transfer gate electrode Tg), and the gate electrodes of reset transistor RST and selection transistor SEL each have a planar shape extending in the up/down direction of the drawing. However, this arrangement is one example, and the arrangement is not limited thereto. For example, transfer gate electrode Tg and reset gate electrode Rg may be arranged to extend substantially in parallel to each other.

Further, amplification transistor AMI as the first transistor in each pixel region of the present embodiment is arranged, within the pixel region, between one transfer gate electrode Tg and the other transfer gate electrode Tg of two transfer gate electrodes Tg with respect to the right/left direction of the drawing in which one transfer gate electrode Tg and the other transfer gate electrode Tg are aligned. Here, "between one transfer gate electrode Tg and the other transfer gate electrode Tg" is not strictly limited to, for example, a region sandwiched between two gate electrodes Tg on a straight line, and also includes a region deviated from a straight line which is formed by precisely connecting a pair of gate electrodes Tg, if a coordinate with respect to the right/left direction of the drawing is between one transfer gate electrode Tg and the other transfer gate electrode Tg. Actually here, amplification transistor AMI within the pixel region is arranged slightly lower than two transfer gate electrodes Tg.

However, here, a consideration will be given of two pixel regions adjacent to each other (in particular with respect to the up/down direction of the drawing connecting photodiode PD and floating diffusion region FD of certain transfer transistor TX), such as the two pixel regions aligned in the up/down direction of FIG. 4, for example. On this occasion, it is preferable to arrange amplification transistor AMI as the first transistor described above between active region AR (in which photodiodes PD are formed) in a first pixel region as one of the two pixel regions and active region AR (in which photodiodes PD are formed) in a second pixel region as the other of the two pixel regions (with respect to the up/down direction of the drawing).

Further, amplification transistor AMI as the first transistor in each pixel region of the present embodiment is arranged, within the pixel region, between one photodiode PD and the other photodiode PD of two photodiode PD with respect to the right/left direction of the drawing in which one photodiode PD and the other photodiode PD are aligned. Here, "between one photodiode PD and the other photodiode PD" is not strictly limited to, for example, a region sandwiched between two photodiodes PD on a straight line, and also includes a region deviated from a straight line which is formed by precisely connecting a pair of photodiodes PD, if a coordinate with respect to the right/left direction of the drawing is between one photodiode PD and the other photodiode PD. Actually here, amplification transistor AMI within the pixel region is arranged slightly lower than two photodiodes PD.

However, also for photodiodes PD, it is preferable to arrange amplification transistor AMI described above between active region AR (in which photodiodes PD are formed) in a first pixel region as one of the two pixel regions and active region AR (in which photodiodes PD are formed) in a second pixel region as the other of the two pixel regions (with respect to the up/down direction of the drawing), as with transfer gate electrodes Tg.

Figure 5:
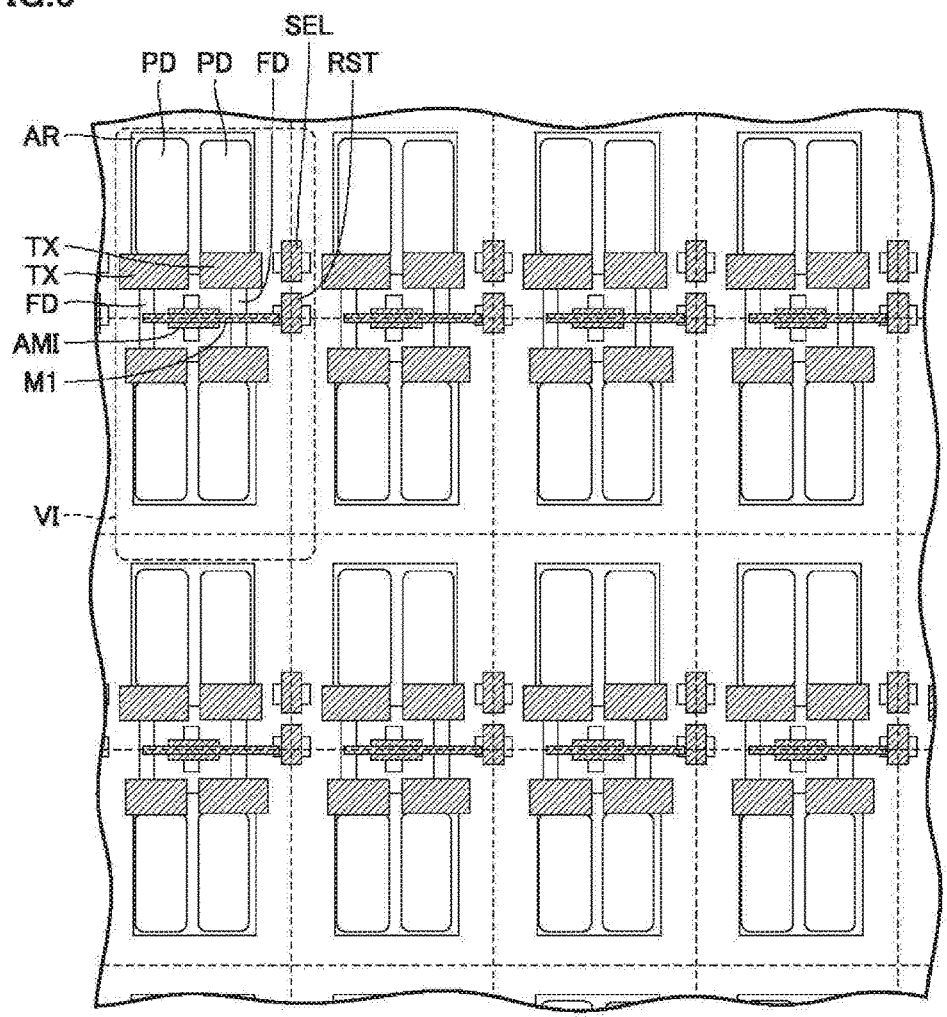
FIG. 5 is a schematic plan view showing a second example of the configuration of the pixel portion of the semiconductor device in the first embodiment.
Figure 6:
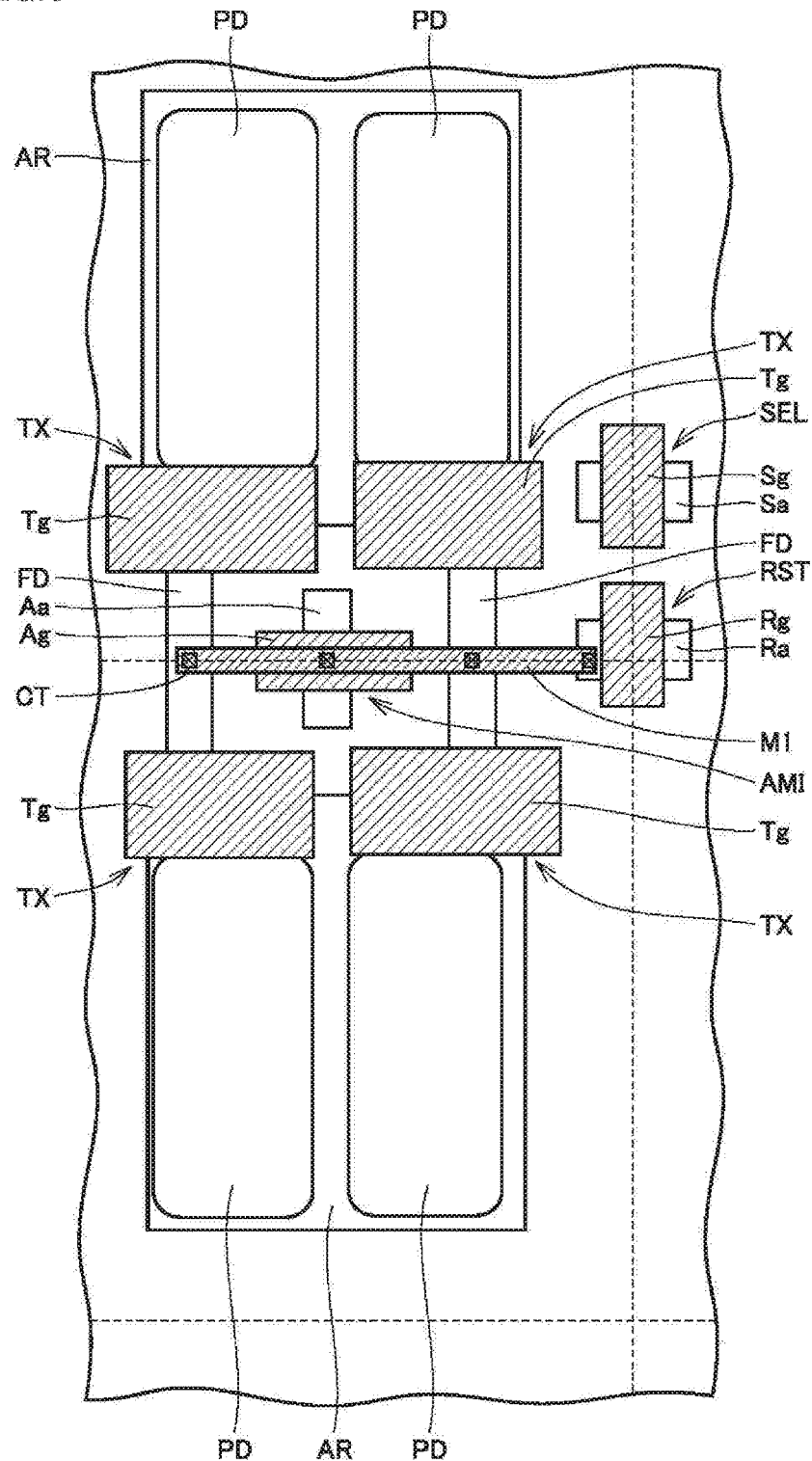
FIG. 6 is an enlarged schematic plan view of a region VI surrounded by a dotted line in FIG. 5.

Referring to FIGS. 5 and 6, in a second example of the present embodiment, each component such as photodiode PD is formed to have basically the same material, shape, and the like as those in the first example of the present embodiment in FIGS. 3 and 4. However, in FIGS. 5 and 6, floating diffusion region FD is shared by photodiode PD and transfer gate electrode Tg within the (first) pixel region thereabove and photodiode PD and transfer gate electrode Tg within the (second) pixel region therebelow in FIGS. 5 and 6.

Namely, in the second example, a pixel portion has a configuration in which one floating diffusion region FD is arranged to straddle the first and second pixel regions adjacent to each other with respect to the up/down direction of the drawing, and two transfer transistors TX are arranged by photodiode PD and transfer gate electrode Tg in each of the first and second pixel regions, and floating diffusion region FD.

However, the configuration of the second example is the same as that of the first example in FIGS. 3 and 4 in that amplification transistor AMI is sandwiched between a pair of floating diffusion regions FD aligned in the right/left direction of the drawing, reset transistor RST is arranged on the outside of two floating diffusion regions FD, components FD, AMI, and RST are aligned in a straight line, and the like. Accordingly, identical elements will be designated by the same reference numerals, and the description thereof will not be repeated.

Figure 7:
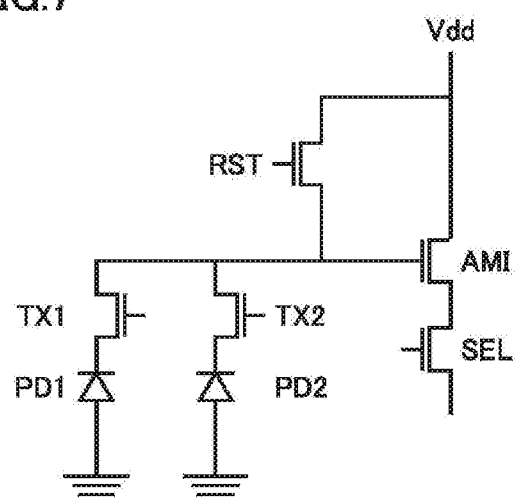
FIG. 7 is a circuit diagram showing the configuration of the pixel portion in the first embodiment.

Referring to FIG. 7, both the first example in FIGS. 3 and 4 and the second example in FIGS. 5 and 6 have a substantially identical configuration when represented in a circuit diagram. Namely, transfer transistor TX (TX1) including one (PD1) of two photodiodes PD and transfer transistor TX (TX2) including the other (PD2) of two photodiodes PD within the upper pixel region shown in each of FIG. 5 and FIG. 6, for example, are connected to amplification transistor AMI (amplification gate electrode Ag) between two floating diffusion regions FD. Amplification gate electrode Ag is connected to reset active region Ra of reset transistor RST. Further, the active regions of amplification transistor AMI and selection transistor SEL are connected. A voltage Vdd is applied to portions of the active regions (any of a source region and a drain region) of reset transistor RST and amplification transistor AMI.

Next, a stack structure above a planar structure of photodiode PD, transfer transistor TX, and the like will be described with reference to the schematic cross sectional view of FIG. 8.

Referring to FIG. 8(A) and FIG. 8(B), it is assumed here that semiconductor substrate SUB is made of silicon containing a p type impurity, for example. Photodiode PD has a surface p type region SPR and an n type region NR. Surface p type region SPR is a p type impurity region formed in a main surface of semiconductor substrate SUB, and extends along the main surface of semiconductor substrate SUB. On the other hand, n type region NR is an n type impurity region formed in the main surface of semiconductor substrate SUB, and is arranged to be in contact with a lower side of surface p type region SPR, for example, to form a pn junction with surface p type region SPR.

Transfer transistor TX including photodiode PD has photodiode PD as a source region, and has floating diffusion region FD made of an n type impurity region, for example, as a drain region, as described above. Further, amplification transistor AMI has an amplification active region made of an n type impurity region, for example, as a source/drain region (although not shown in FIG. 8), and reset transistor RST has reset active region Ra made of an n type impurity region, for example, as a source/drain region.

Transfer transistor TX mainly has a gate insulating film GI made of a silicon oxide film, for example, transfer gate electrode Tg arranged on one main surface of gate insulating film GI (to be in contact with the one main surface), and a sidewall insulating film SW made of a silicon oxide film, for example, covering at least a portion of a side wall of transfer gate electrode Tg.

Similarly, amplification transistor AMI mainly has gate insulating film GI made of a silicon oxide film, for example, amplification gate electrode Ag arranged on one main surface of gate insulating film GI (to be in contact with the one main surface), and sidewall insulating film SW made of a silicon oxide film, for example, covering at least a portion of a side wall of amplification gate electrode Ag. Reset transistor RST mainly has gate insulating film GI made of a silicon oxide film, for example, reset gate electrode Rg arranged on one main surface of gate insulating film GI (to be in contact with the one main surface), and sidewall insulating film SW made of a silicon oxide film, for example, covering at least a portion of a side wall of reset gate electrode Rg. Further, although not shown in the cross sectional view of FIG. 8, selection transistor SEL also has a configuration basically identical to that of reset transistor RST.

In the main surface of semiconductor substrate SUB, transfer transistor TX, amplification transistor AMI, and reset transistor RST (and selection transistor SEL not shown) are each electrically separated from each other by an element separation film SPT.

An interlayer insulating film II1 is formed to cover the various transistors described above, an interlayer insulating film II2 is formed to cover interlayer insulating film II1, an interlayer insulating film II3 is formed to cover interlayer insulating film II2, and an interlayer insulating film II4 is formed to cover interlayer insulating film II3. Although four interlayer insulating films are stacked as described above in FIG. 8, any number of interlayer insulating films may be stacked.

Wire M1 is formed to be in contact with a portion of an upper surface of interlayer insulating film II1. Similarly, a wire M2 is formed to be in contact with a portion of an upper surface of interlayer insulating film II2, and a wire M3 is formed to be in contact with a portion of an upper surface of interlayer insulating film II3. Although these wires are each formed of a thin film of aluminum, for example, they are not limited thereto. Here, for convenience, wire M1 is classified into a wire M1a connected to amplification gate electrode Ag, a wire M1b connected to reset gate electrode Rg and connected to wire M2, and a wire M1c which leads from reset active region Ra to wires M2 and M3. Electrical connection between the wires in different layers is established by contacts CT extending through each interlayer insulating film in a thickness direction.

Wire M3 is formed as a light shielding film which suppresses incidence of light on photodiode PD, in particular immediately above transfer transistor TX. Further, a color filter FLT and a lens LNS are formed on an upper surface of interlayer insulating film II4 in an opening in wire M3 (immediately above photodiode PD).

Lens LNS has a function of taking in the light incident on photodiode PD. Color filter FLT is a filter for converting the light incident on photodiode PD into light having a wavelength of any of red, green, and blue light. Namely, among a plurality of solid-state imaging elements aligned in the pixel portion, red, green and blue color filters FLT are aligned at a fixed number ratio. Further, wire M3 as a light shielding film is formed in a region other than immediately below lens LNS (immediately above photodiode PD) in order to suppress incidence of light on photodiode PD from a region other than lens LNS.

Next, a method for manufacturing the semiconductor device in the present embodiment described above will be described with reference to FIGS. 9 to 14 and FIG. 8, with a special emphasis on the regions shown in the cross sectional views of FIG. 8(A) and FIG. 8(B).

Referring to FIG. 9(A) and FIG. 9(B), first, semiconductor substrate SUB made of silicon, for example, and containing an n type or p type conductive impurity is prepared. Next, on a portion of a main surface S1 of semiconductor substrate SUB, element separation film SPT for separating a region where a transfer transistor is to be formed (including a region where a photodiode is to be formed), a region where an amplification transistor is to be formed, and a region where a reset transistor is to be formed is formed by a commonly known method.

Thereafter, referring to FIG. 9(A) in particular, in the region where the transfer transistor is to be formed, the region where the photodiode is to be formed (active region AR) is formed within semiconductor substrate SUB by common photolithographic technique and ion implantation technique, for example, to include the region where the photodiode is to be formed. Further, although not shown, a well region may be formed as necessary within semiconductor substrate SUB.

Figure 9:
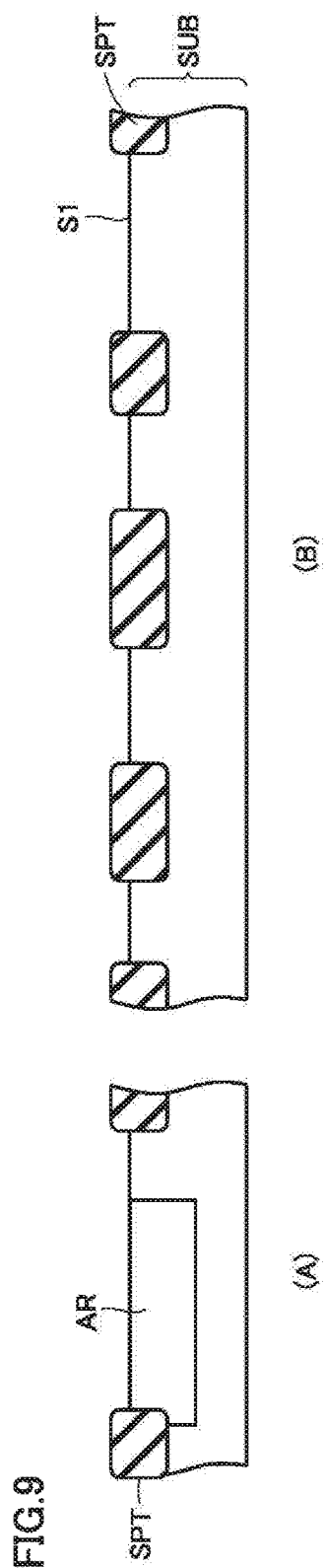
FIG. 9 is a schematic cross sectional view showing a first step of a method for manufacturing the semiconductor device in the first embodiment.
Figure 10:
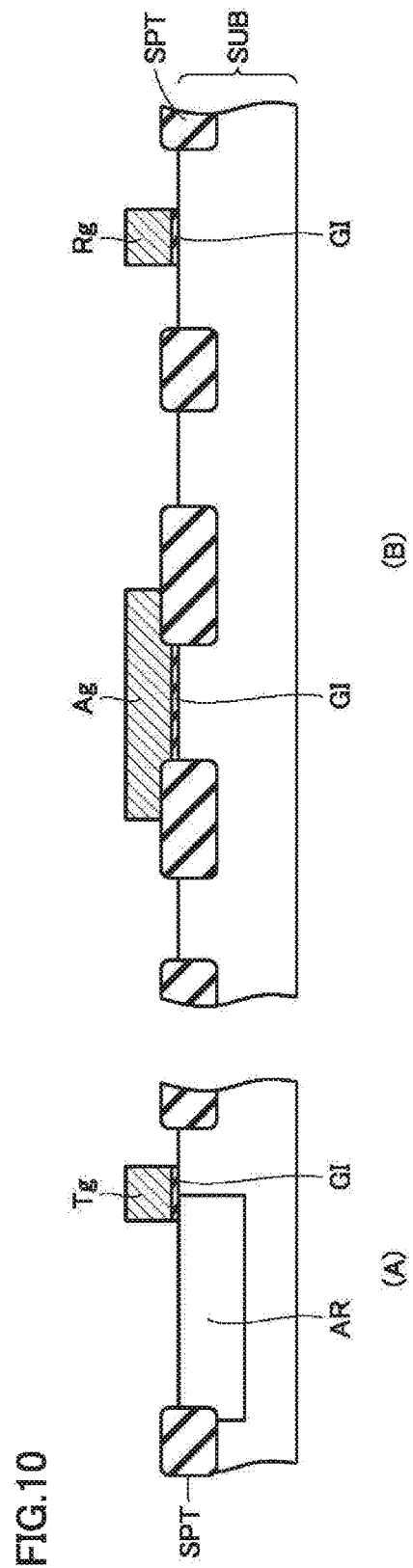
FIG. 10 is a schematic cross sectional view showing a second step of the method for manufacturing the semiconductor device in the first embodiment.

Furthermore, by common photolithographic technique and ion implantation technique, a channel region not shown in FIG. 9 is formed as necessary in the vicinity of main surface S1 within semiconductor substrate SUB. This channel region is a region which is formed in a region immediately below a region where a gate electrode and the like of the transfer transistor are formed, for example, and in which a slight amount of impurity is implanted.

Referring to FIG. 10(A) and FIG. 10(B), next, an insulating film made of a silicon oxide film is formed on the main surface of semiconductor substrate SUB (except for an upper surface of element separation film SPT) by a common thermal oxidation method, for example. Next, a thin film of polycrystalline silicon containing a conductive impurity is formed to cover the insulating film and element separation film SPT, by a common CVD (Chemical Vapor Deposition) method, for example. A pattern of a photoresist using a known photosensitizing agent is formed by common photolithographic technique and etching technique. Using a mask of this photoresist, the thin film of polycrystalline silicon is etched, and transfer gate electrode Tg, amplification gate electrode Ag, and reset gate electrode Rg are formed. The etching of this thin film of polycrystalline silicon is performed by a common RIE (Reactive Ion Etching) method, for example. Thereafter, the photoresist described above is removed, and as a result, the insulating film other than that immediately below transfer gate electrode Tg and the like is removed, and the insulating film remaining immediately below transfer gate electrode Tg and the like serves as gate insulating film GI.

Figure 11:
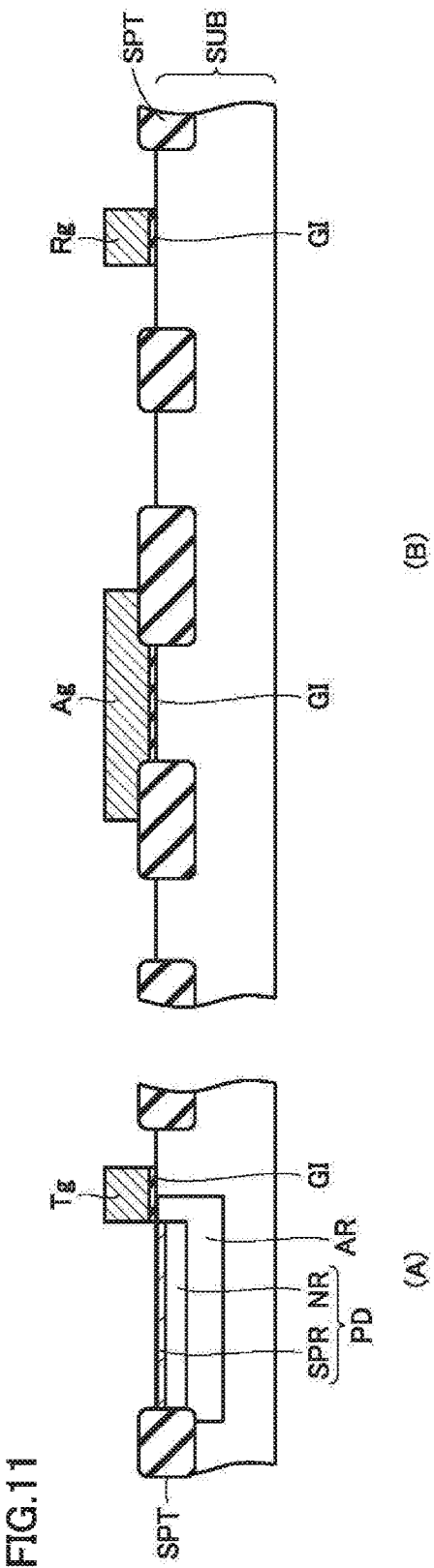
FIG. 11 is a schematic cross sectional view showing a third step of the method for manufacturing the semiconductor device in the first embodiment.

Referring to FIG. 11, within semiconductor substrate SUB, in the region where the photodiode is to be formed (active region AR), n type region NR and surface p type region SPR are formed in this order by common photolithographic technique and ion implantation technique, and thereby photodiode PD is formed.

Figure 12:
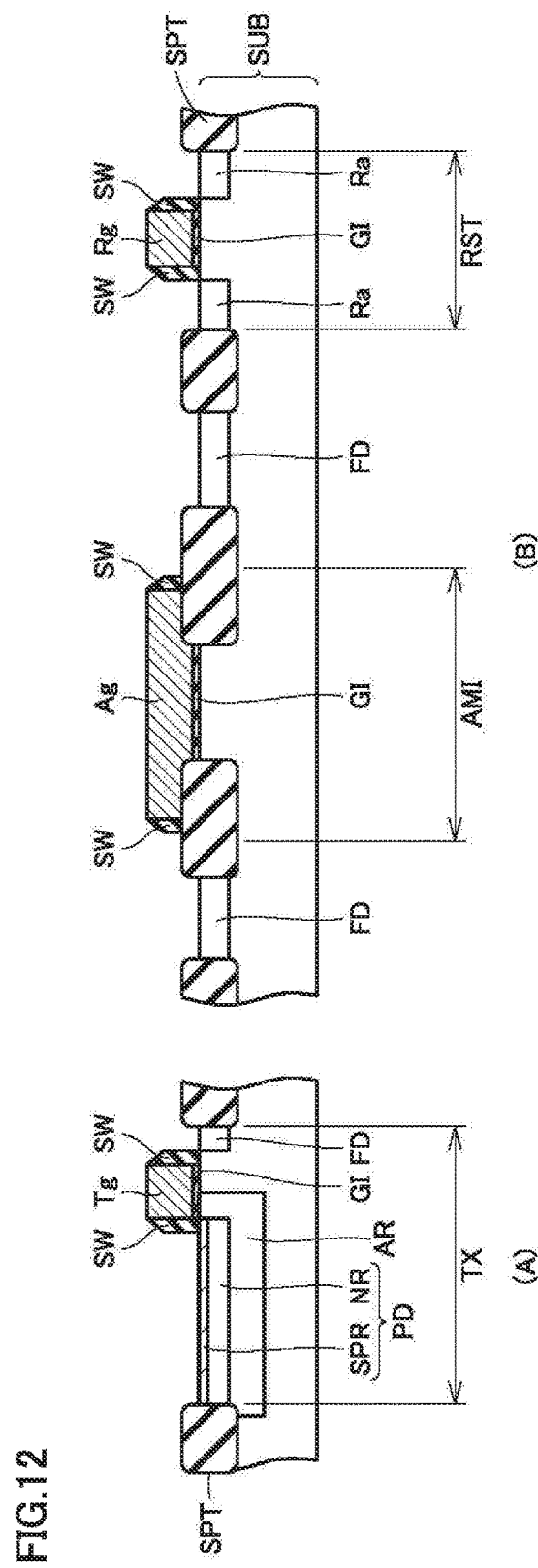
FIG. 12 is a schematic cross sectional view showing a fourth step of the method for manufacturing the semiconductor device in the first embodiment.

Referring to FIG. 12, floating diffusion region FD, reset active region Ra, and an amplification active region and a selection active region not shown, as ion implantation regions containing an n type conductive impurity, for example, are formed by common photolithographic technique and ion implantation technique. Next, sidewall insulating film SW having a configuration in which a silicon oxide film and a silicon nitride film, for example, are stacked in this order is formed by common CVD method and etchback, for example.

Figure 13:
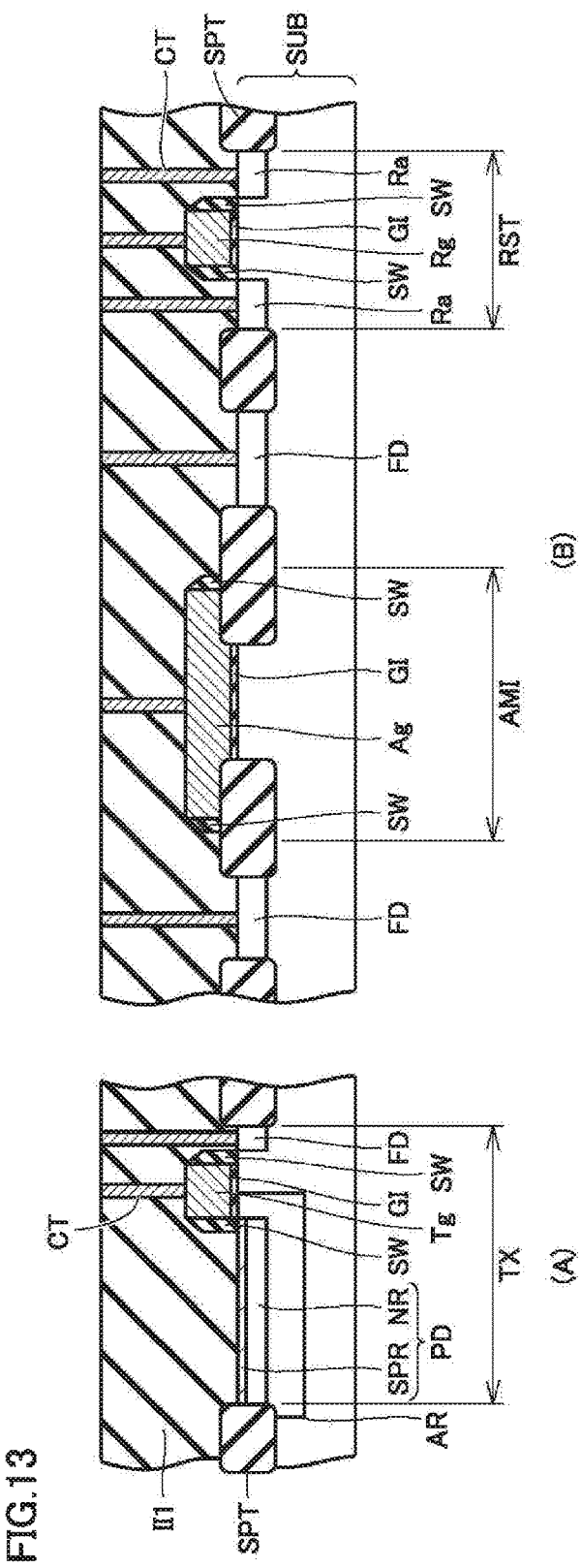
FIG. 13 is a schematic cross sectional view showing a fifth step of the method for manufacturing the semiconductor device in the first embodiment.

Referring to FIG. 13, interlayer insulating film II1 made of a silicon oxide film is formed using the CVD method, for example. Thereafter, interlayer insulating film II1 is polished by a chemical mechanical polishing method called CMP (Chemical Mechanical Polishing) such that its upper surface becomes flat. Further, via halls are formed in interlayer insulating film II1 by common photolithographic technique and etching technique, to reach transfer gate electrode Tg, amplification gate electrode Ag, reset gate electrode Rg, floating diffusion region FD, reset active region Ra, and the like. The via halls are formed by stopping etching when they reach upper surfaces of gate electrodes Tg, Ag, and Rg utilizing the difference in etching selectivity between interlayer insulating film II1 (silicon oxide film) and gate electrodes Tg, Ag, and Rg (polycrystalline silicon).

Next, the via holes are filled with a conductive film made of tungsten, for example, and thereby contacts CT are formed inside the via holes. For this processing, the CVD method is used, for example, and a thin film of tungsten is also formed on interlayer insulating film II1. The thin film of tungsten on interlayer insulating film II1 is removed by CMP.

Figure 14:
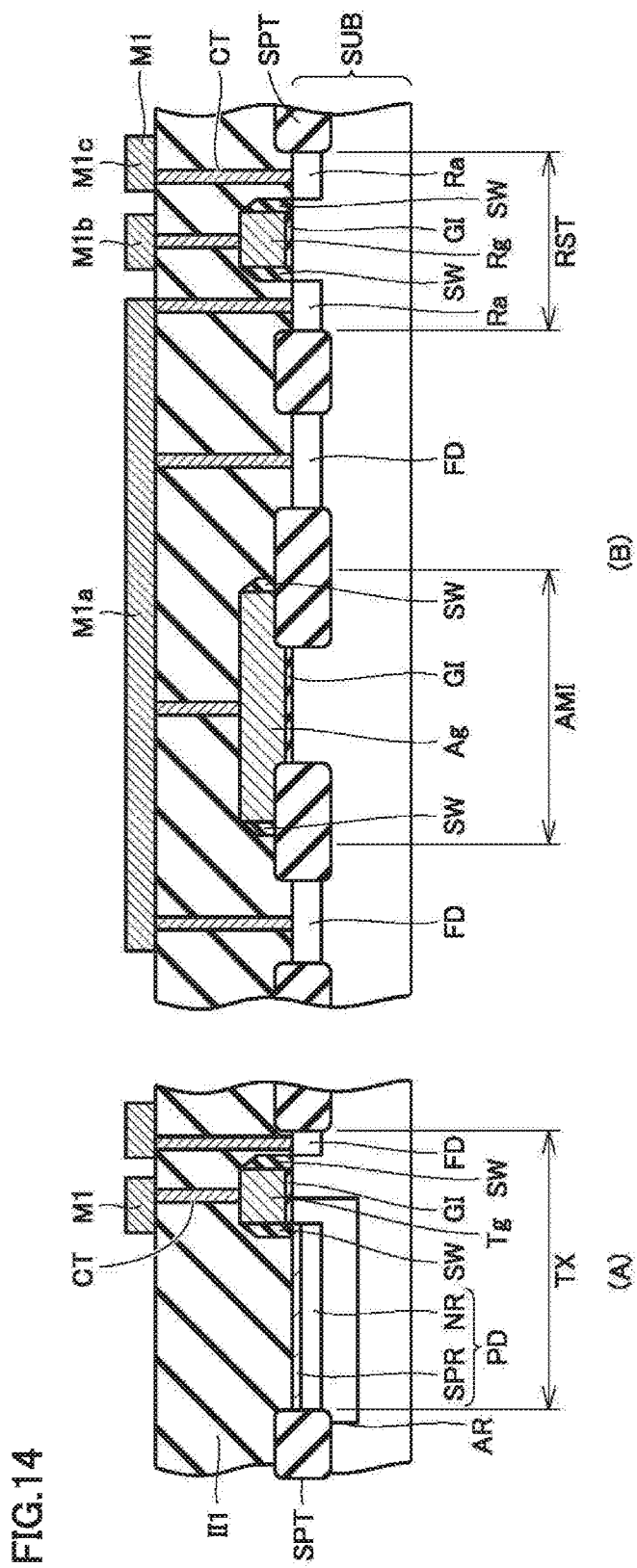
FIG. 14 is a schematic cross sectional view showing a sixth step of the method for manufacturing the semiconductor device in the first embodiment.

Referring to FIG. 14, on interlayer insulating film II1, a thin film made of aluminum, for example, is formed by sputtering, for example. Then, wire M1 made of aluminum, for example, is formed immediately above contacts CT by common photolithographic technique and etching technique.

Figure 8:
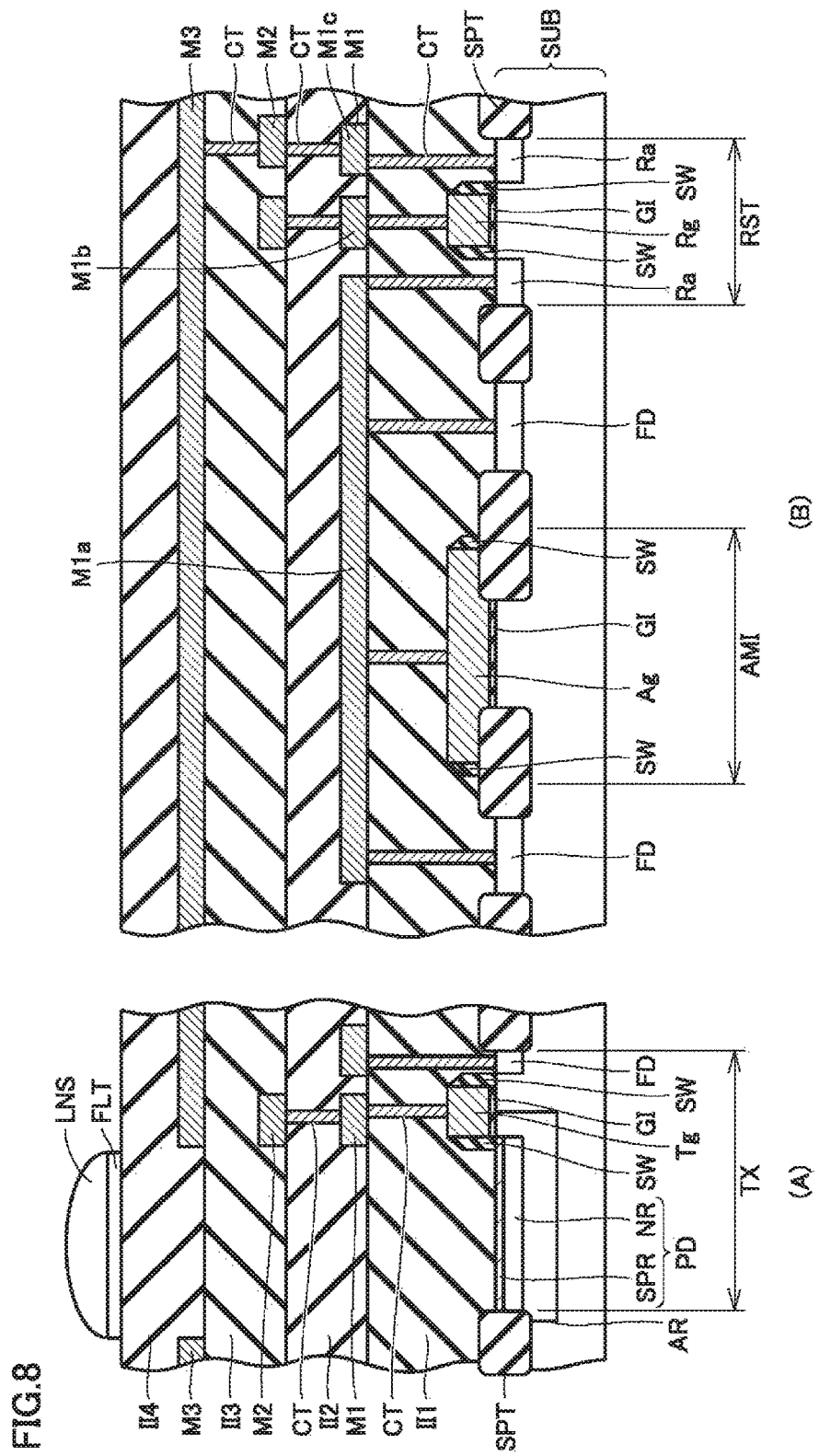
FIG. 8(A) is a schematic cross sectional view of a portion taken along a line VIIIA-VIIIA in FIG. 4.
FIG. 8(B) is a schematic cross sectional view of a portion taken along a line VIIIB-VIIIB in FIG. 4.

Referring to FIG. 8, next, interlayer insulating film II2 made of a silicon oxide film is formed to cover interlayer insulating film II1 and wire M1, and via holes like the via holes described above are formed in desired regions (in particular, on wires M1b and M1c of wire M1) to reach wire M1. Next, the via holes are filled with a conductive film made of tungsten, for example, as in the step in FIG. 12, and thereby contacts CT are formed.

Further, by the same step as that described above, wire M2 made of aluminum, for example, is formed immediately above contacts CT in interlayer insulating film II2, and interlayer insulating film II3 made of a silicon oxide film is formed to cover interlayer insulating film II2 and wire M2.

On interlayer insulating film II3, a thin film of a metal material such as aluminum or tungsten, for example, having a low permeability to light is formed by sputtering, for example. Then, the thin film of the metal material is patterned by common photolithographic technique and etching technique to remain in a region other than immediately above photodiode PD, and wire M3 also serving as a light shielding film is formed.

Thereafter, interlayer insulating film II4 made of a silicon oxide film is formed, and color filter FLT and lens LNS are formed on interlayer insulating film II4, immediately above photodiode PD. Through the steps described above, the semiconductor device having a solid-state imaging element of one embodiment is formed.

Next, the function and effect of the present embodiment will be described with reference to FIG. 15 as a comparative example.

Figure 15:
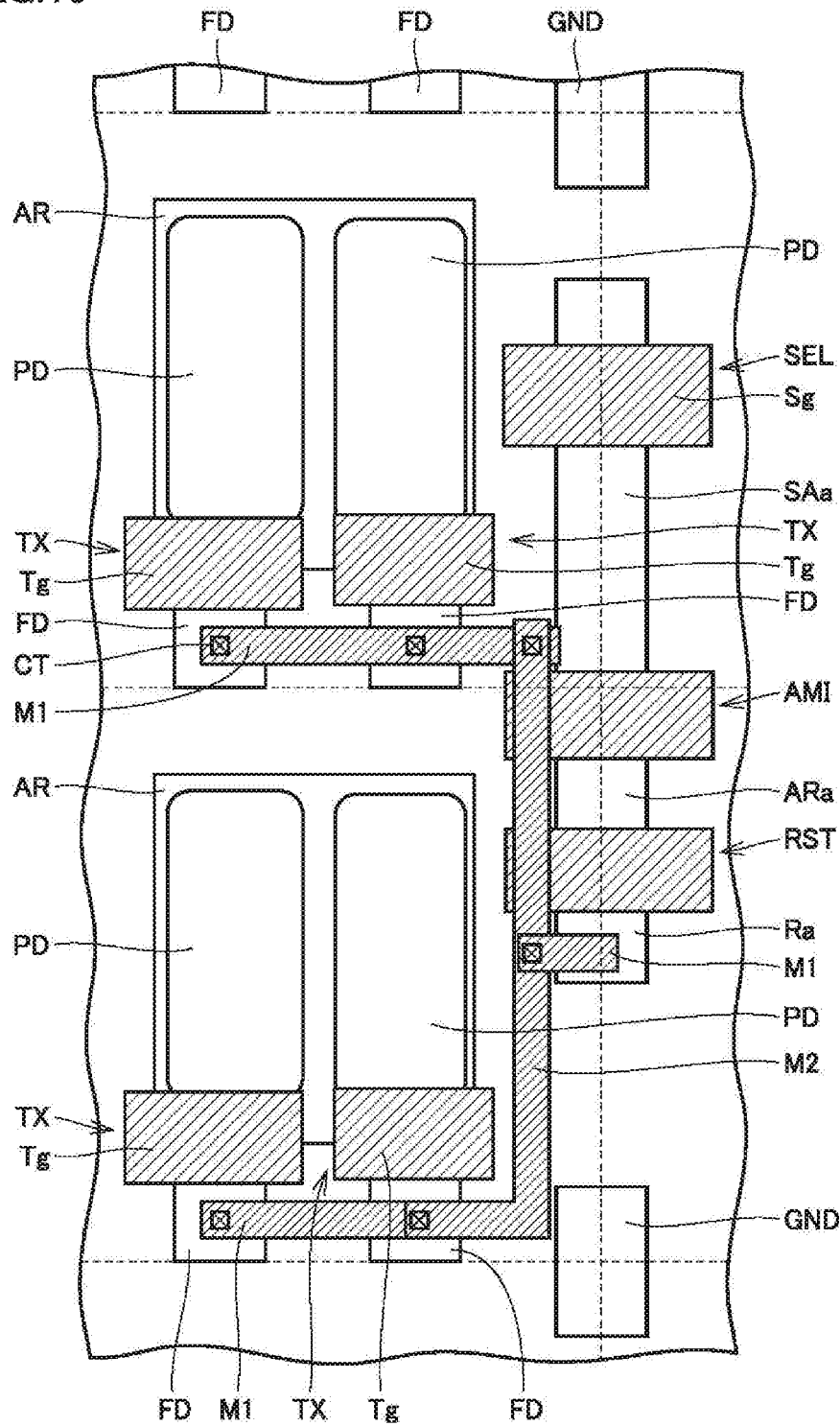
FIG. 15 is an enlarged schematic plan view showing a configuration of a pixel portion in a comparative example.

Referring to FIG. 15, also in a semiconductor device of the comparative example, active region AR is formed in each of a plurality of pixel regions aligned in a matrix, and two photodiodes PD are arranged to be spaced from each other within active region AR, as in the present embodiment. Further, two floating diffusion regions FD are arranged within each pixel region to allow accumulation of electric signals from two photodiodes PD. In this regard, the configuration shown in FIG. 15 is the same as the configuration of the first example of the present embodiment shown in FIG. 4.

However, in the comparative example, both reset transistor RST and amplification transistor AMI within one pixel region are arranged at positions away from two transfer transistors TX (in particular, two floating diffusion regions FD) within the pixel region, and are at least not arranged between one and the other floating diffusion regions FD (or transfer gate electrodes Tg or photodiodes PD) with respect to the right/left direction of the drawing. In this case, wires M1 and M2 routed from floating diffusion regions FD to reset active region Ra for electrical connection have significantly increased lengths, as shown in the drawing. This causes an increase in wire capacitance formed by wires M1 and M2 and interlayer insulating films adjacent thereto. This wire capacitance may exert an unintended influence on the operation of the semiconductor device, as a parasitic capacitance, for example.

It should be noted that, in the comparative example in FIG. 15, selection transistor SEL, amplification transistor AMI, and reset transistor RST are aligned like a straight line in the up/down direction of the drawing in a plan view, and ground pads GND are arranged on extensions of the straight line. Further, in FIG. 15, selection transistor SEL and amplification transistor AMI share an active region SAa, and amplification transistor AMI and reset transistor RST share an active region ARa. However, the arrangement of components in the comparative example in FIG. 15 is not limited to such a manner.

Accordingly, in the present embodiment, amplification transistor AMI is arranged between one and the other floating diffusion regions FD of two transfer transistors TX within one pixel region, with respect to the right/left direction in which floating capacitance regions FD are aligned, as shown in FIGS. 3 to 6. Although amplification transistor AMI in the first pixel region does not necessarily have to be arranged to be aligned with two floating diffusion regions FD in a straight line, amplification transistor AMI is at least arranged on a first pixel region side (for example, on an upper side) when compared with the active region within the second pixel region adjacent thereto (for example, on a lower side) with respect to the up/down direction of the drawing.

By arranging the first transistor (amplification transistor AMI) between a pair of floating diffusion regions FD corresponding to the drain regions through which the electric signals are output from transfer transistors TX as shown in FIGS. 4 and 6, wire M1 used for electrical connection between the drain regions and (amplification gate electrode Ag, for example, of) amplification transistor AMI can have a significantly shortened length when compared with that of the comparative example in FIG. 15. Accordingly, wire capacitance can be reduced.

Further, in the present embodiment, amplification transistor AMI is arranged between two transfer gate electrodes Tg of a pair of transfer transistors TX within one pixel region with respect to a direction in which transfer gate electrodes Tg are aligned, and arranged between two photodiodes PD of a pair of transfer transistors TX within one pixel region with respect to a direction in which photodiodes PD are aligned. Also thereby, wire M1 can have a significantly shortened length when compared with that of the comparative example in FIG. 15, in the same way as described above. Accordingly, wire capacitance can be reduced.

In particular, when each of a pair of floating diffusion regions FD and the first transistor (amplification transistor AMI) are arranged to be aligned on a straight line in a plan view as in the present embodiment, the wire can be further shortened. In addition, the layout efficiency of the components within chip region IMC can be improved, and the semiconductor device can be further highly integrated.

In the present embodiment, amplification transistor AMI described above is shared by a pair of transfer transistors TX which sandwich the same. Namely, within one pixel region, two transfer transistors TX are arranged, whereas only one amplification transistor AMI is arranged. Accordingly, the number of components arranged within chip region IMC can be reduced, when compared with a case where, for example, one amplification transistor AMI is arranged for each transfer transistor TX (namely, two amplification transistors AMI are arranged within one pixel region). Thereby, chip region IMC can be decreased in size, and the semiconductor device can be further highly integrated.

Further, in the present embodiment, each of the plurality of pixel regions includes reset transistor RST as the second transistor, and reset transistor RST is aligned with each of a pair of floating diffusion regions FD within each pixel region on a straight line in a plan view. Thereby, wire M1 which connects the second transistor and the first transistor can be further shortened. In addition, the layout efficiency of the components within chip region IMC can be improved, and the semiconductor device can be further highly integrated.

Furthermore, a configuration in which transfer transistors TX (photodiodes PD) in the first and second pixel regions adjacent to each other share floating diffusion region FD (so-called facing-type configuration) as in the second example in FIGS. 5 and 6, for example, is conceivable. In this case, the layout efficiency of the components within chip region IMC can be improved, and the semiconductor device can be further highly integrated, when compared with a configuration in which each transfer transistor TX holds one floating diffusion region FD (so-called parallel-type configuration) as in the first example in FIGS. 3 and 4.

(Second Embodiment)

Figure 16:
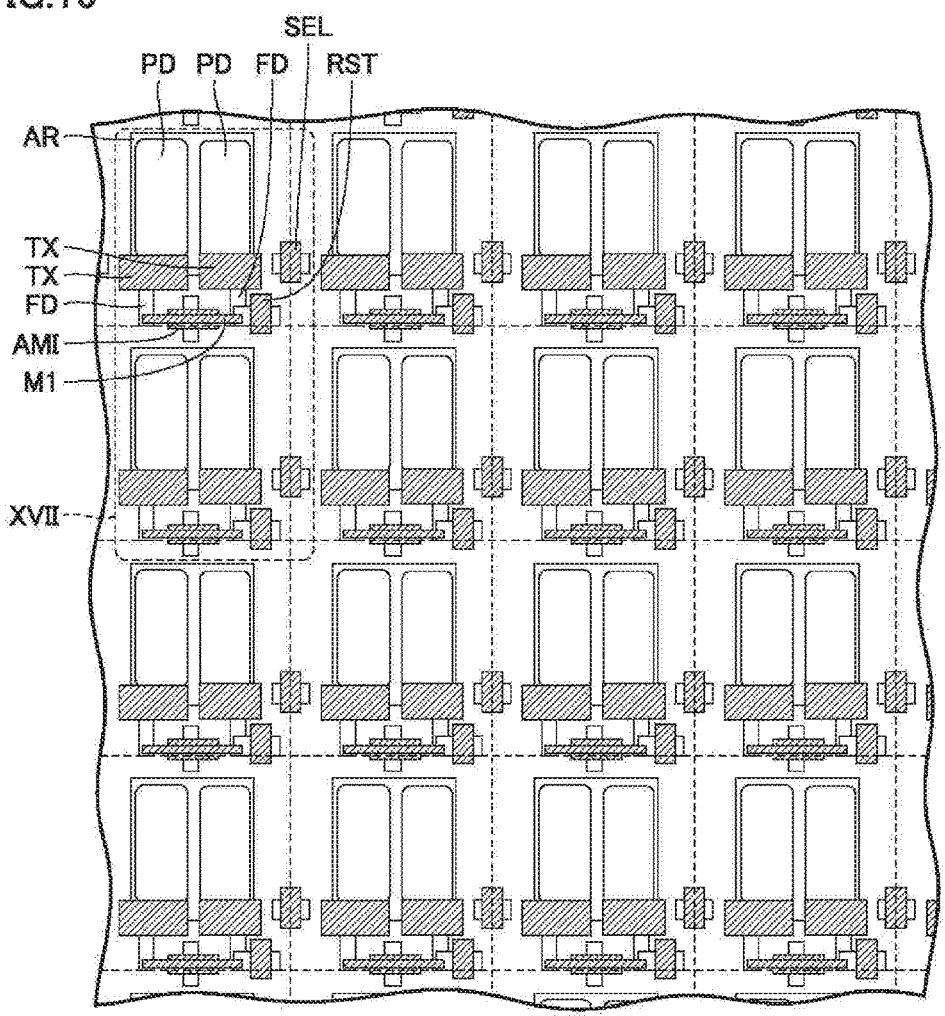
FIG. 16 is a schematic plan view showing a first example of a configuration of a pixel portion of a semiconductor device in a second embodiment.
Figure 17:
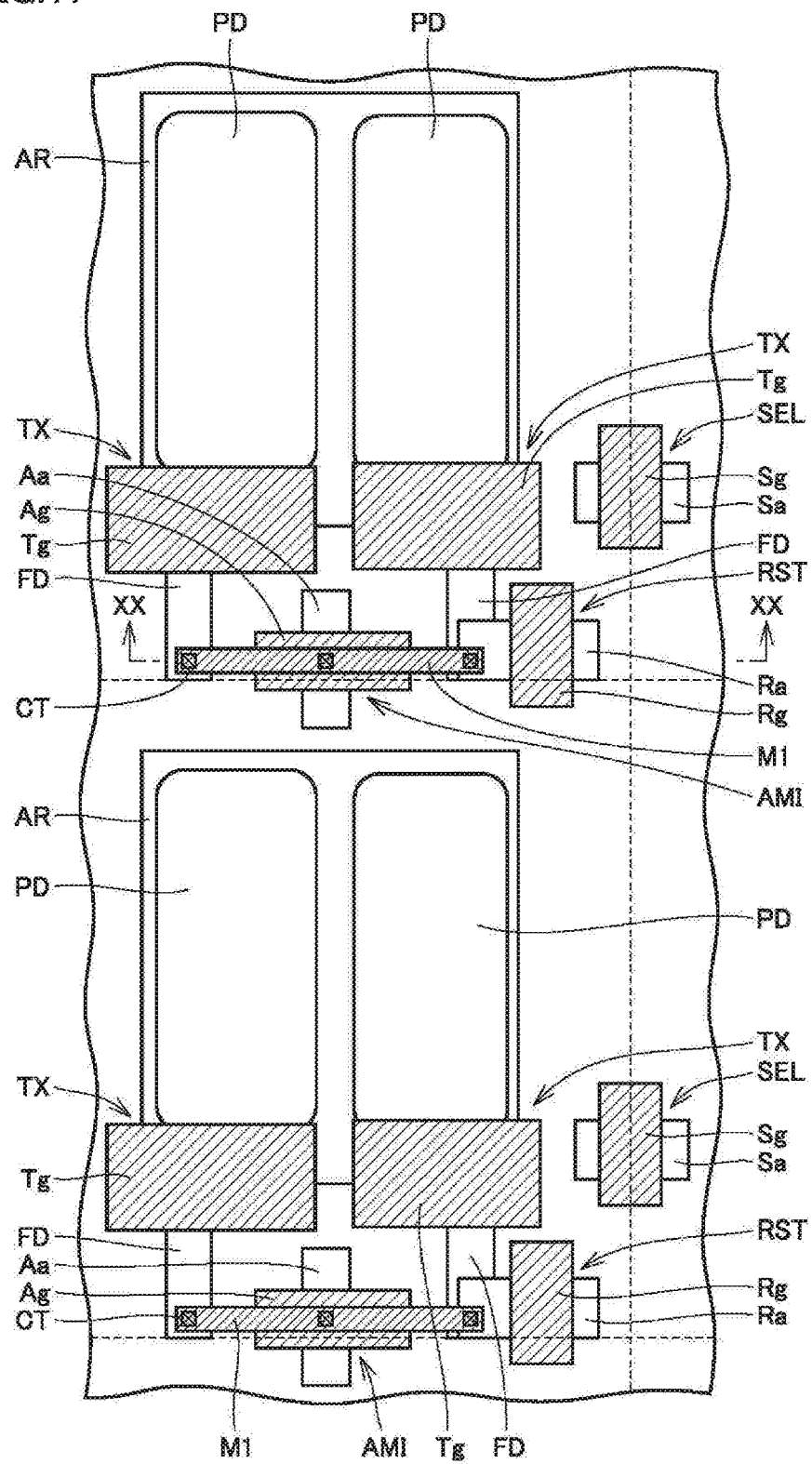
FIG. 17 is an enlarged schematic plan view of a region XVII surrounded by a dotted line in FIG. 16.

Referring to FIGS. 16 and 17, a semiconductor device in a first example of the present embodiment has a so-called parallel-type configuration, basically as in the first example of the first embodiment in FIGS. 3 and 4. However, in the present embodiment, a portion of reset active region Ra of reset transistor RST (the second transistor), that is, at least a portion of any of a source region and a drain region of reset transistor RST, overlaps, in a plan view, with any of two floating diffusion regions FD within a pixel region where reset transistor RST is arranged.

Figure 18:
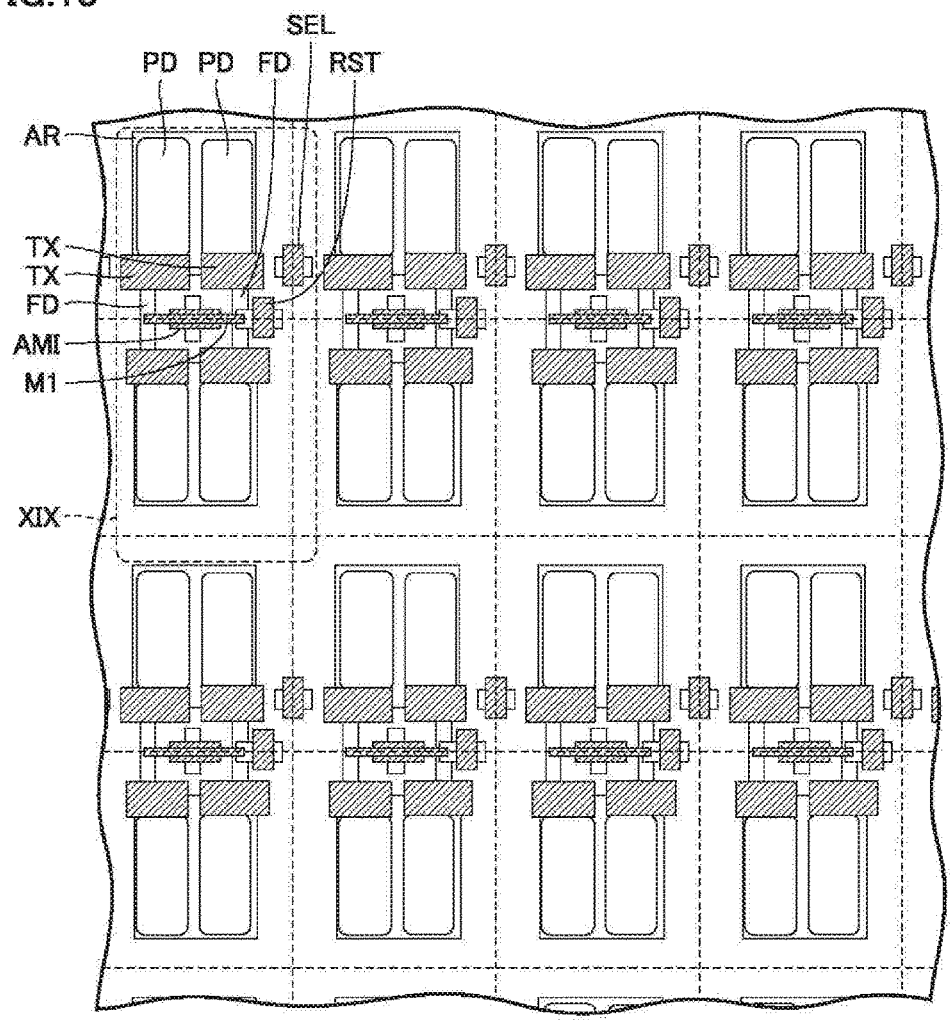
FIG. 18 is a schematic plan view showing a second example of the configuration of the pixel portion of the semiconductor device in the second embodiment.
Figure 19:
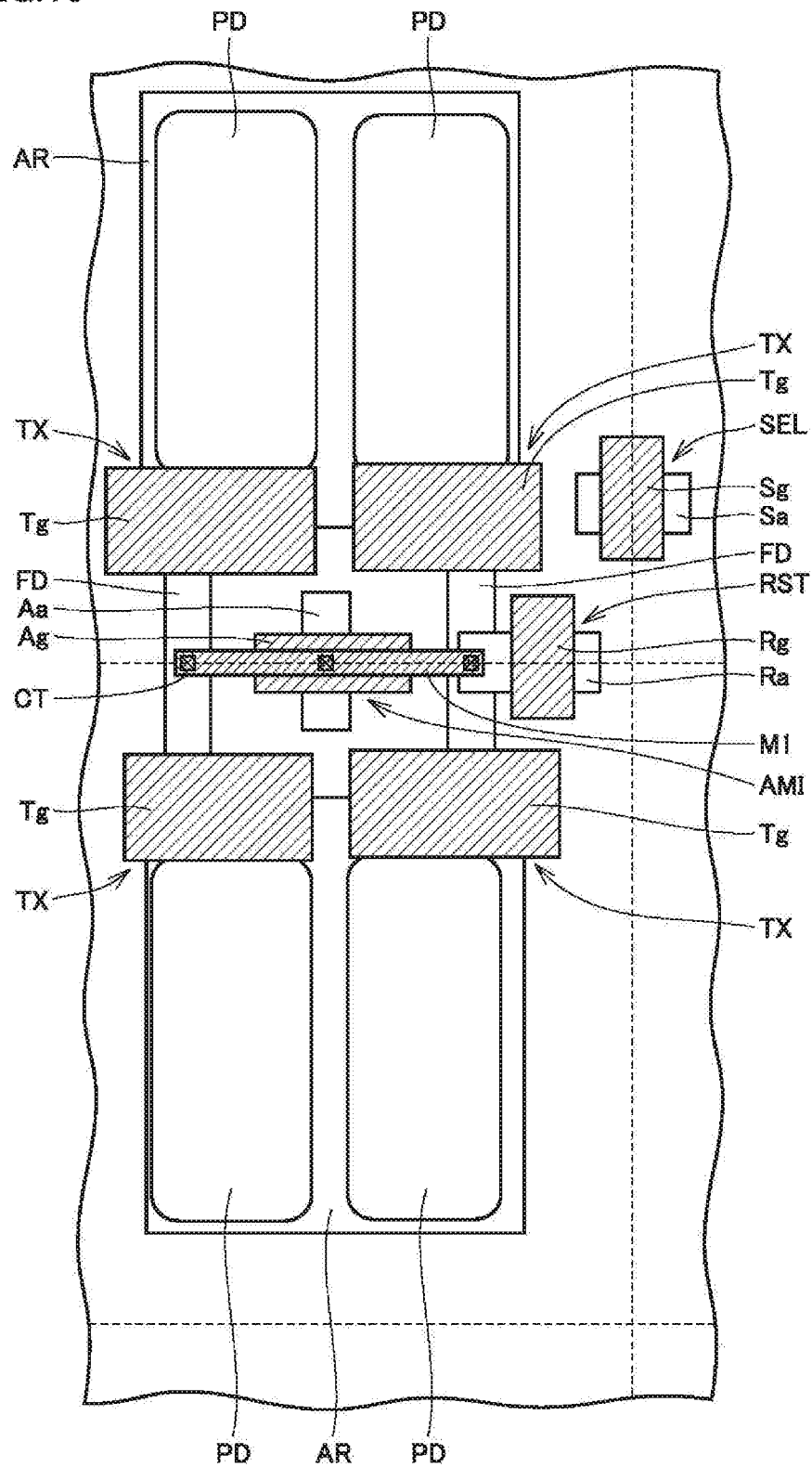
FIG. 19 is an enlarged schematic plan view of a region XIX surrounded by a dotted line in FIG. 18.

Referring to FIGS. 18 and 19, a semiconductor device in a second example of the present embodiment has a so-called facing-type configuration, basically as in the second example of the first embodiment in FIGS. 5 and 6. However, in the present embodiment, a portion of reset active region Ra of reset transistor RST, that is, at least a portion of any of the source region and the drain region of reset transistor RST, overlaps, in a plan view, with any of two floating diffusion regions FD within a pixel region where reset transistor RST is arranged.

Figure 20:
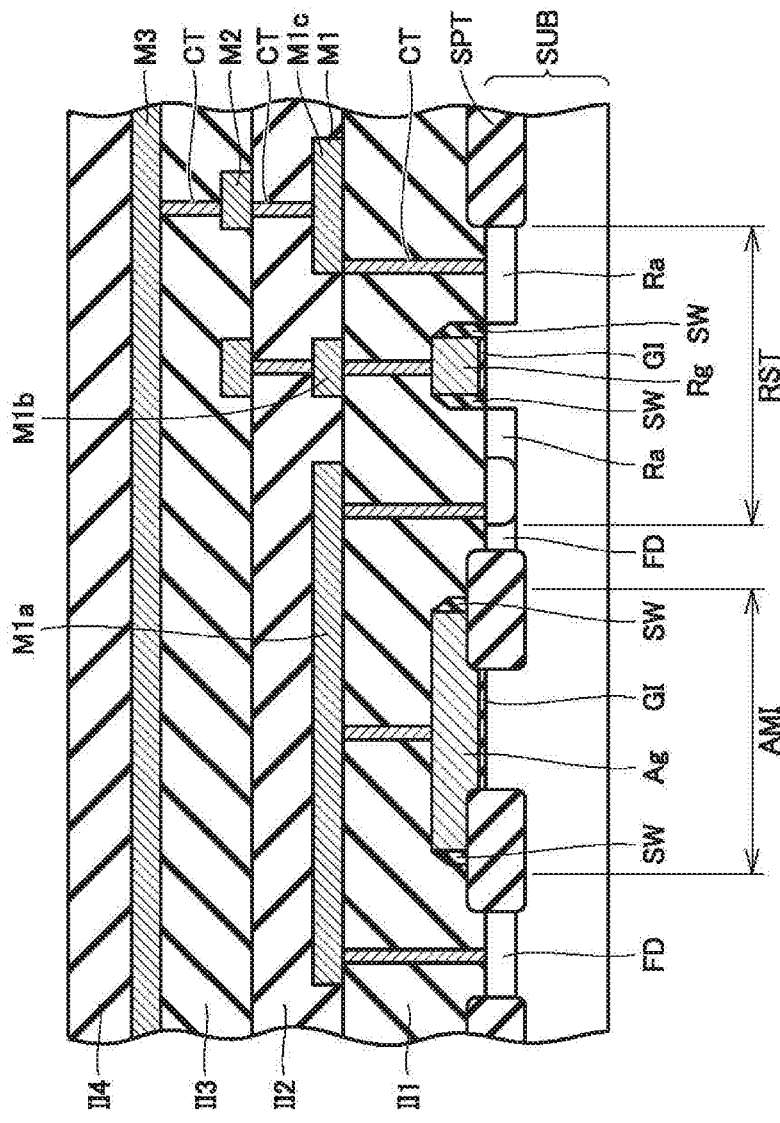
FIG. 20 is a schematic cross sectional view of a portion taken along a line XX-XX in FIG. 17.

In both the first example and the second example described above, floating diffusion region FD and reset active region Ra overlapping with each other are connected with wire M1 through contact CT. From floating diffusion region FD and reset active region Ra overlapping with each other to floating diffusion region FD on a side opposite thereto, wire M1 extends on a straight line, for example. Floating diffusion region FD on the opposite side is connected with wire M1 through contact CT. Wire M1 is also connected with amplification gate electrode Ag through contact CT. Referring to FIG. 20, the configuration of this schematic cross sectional view has basically the same configuration as that of the first embodiment in FIG. 8(B) except that source/drain region Ra of reset transistor RST and floating diffusion region FD at least partially overlap. Therefore, wire M1a in FIG. 20 has a length in the right/left direction of the drawing shorter than that of wire M1a in FIG. 8(B). It should be noted that the cross sectional view in the present embodiment with respect to the same direction as that in the cross sectional view of FIG. 8(A) is omitted because it is the same as that of FIG. 8(A). In addition, the circuit diagram of the configuration of the present embodiment is omitted because it is the same as that of FIG. 7.

Other than the above exception, the configuration of the present embodiment is substantially the same as the configuration of the first embodiment, and thus identical elements will be designated by the same reference numerals, and the description thereof will not be repeated.

Next, the function and effect of the present embodiment will be described.

When source/drain region Ra of reset transistor RST and floating diffusion region FD at least partially overlap as in the present embodiment, wire M1 which connects source/drain region Ra of reset transistor RST and floating diffusion region FD in the first embodiment (FIGS. 3 to 6) can be omitted, for example. Therefore, wire M1 in the present embodiment is shorter than wire M1 in the first embodiment, and thus wire capacitance due to wire M1 can be further reduced.

It should be noted that, in the present embodiment, amplification gate electrode Ag of amplification transistor AMI extends in the right/left direction in FIGS. 16 to 19, for example, and reset gate electrode Rg of reset transistor RST extends in the up/down direction in FIGS. 16 to 19, for example. Namely, in the present embodiment, amplification gate electrode Ag of amplification transistor AMI (a first gate electrode) and reset gate electrode Rg of reset transistor RST (a second gate electrode) extend in directions intersecting with each other (for example, orthogonal to each other) in a plan view. Further, since floating diffusion regions FD extend in the up/down direction in FIGS. 16 to 19, floating diffusion regions FD and reset gate electrode Rg extend substantially in parallel to each other in a plan view (i.e., floating diffusion regions FD and amplification gate electrode Ag extend in directions intersecting with each other in a plan view). Thereby, a layout in which reset active region Ra and floating diffusion region FD overlap can be easily designed.

(Third Embodiment)

Figure 21:
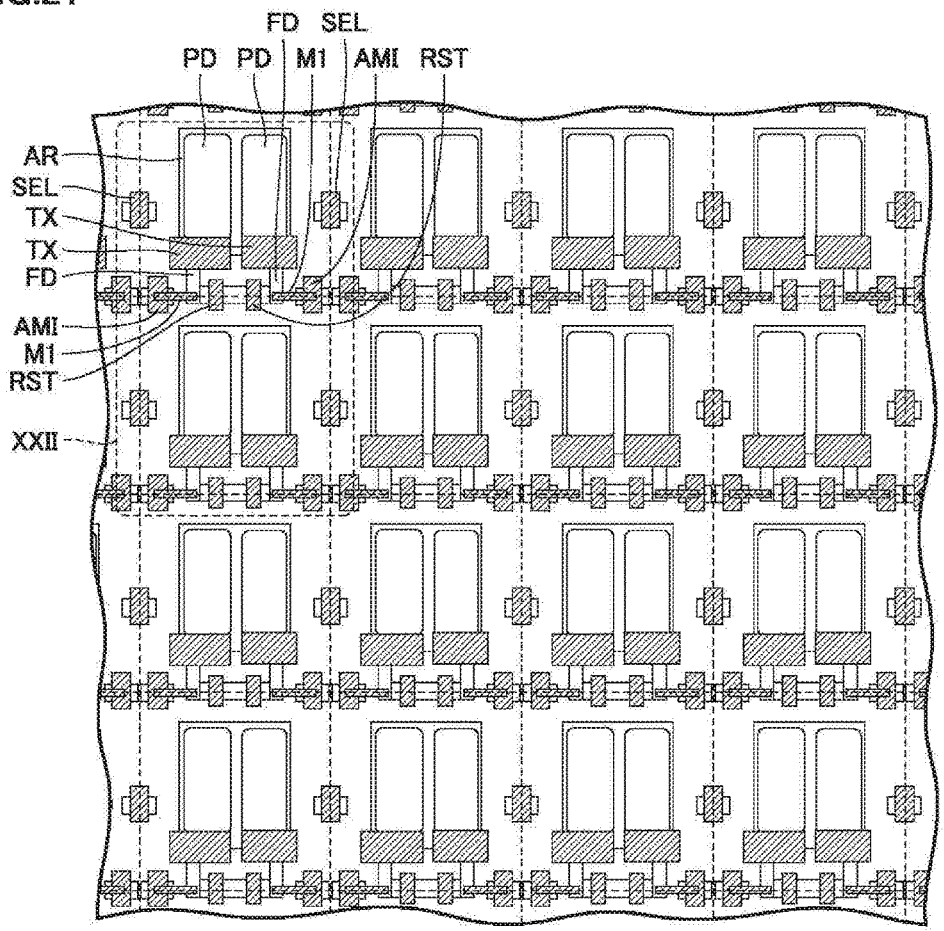
FIG. 21 is a schematic plan view showing a first example of a configuration of a pixel portion of a semiconductor device in a third embodiment.
Figure 22:
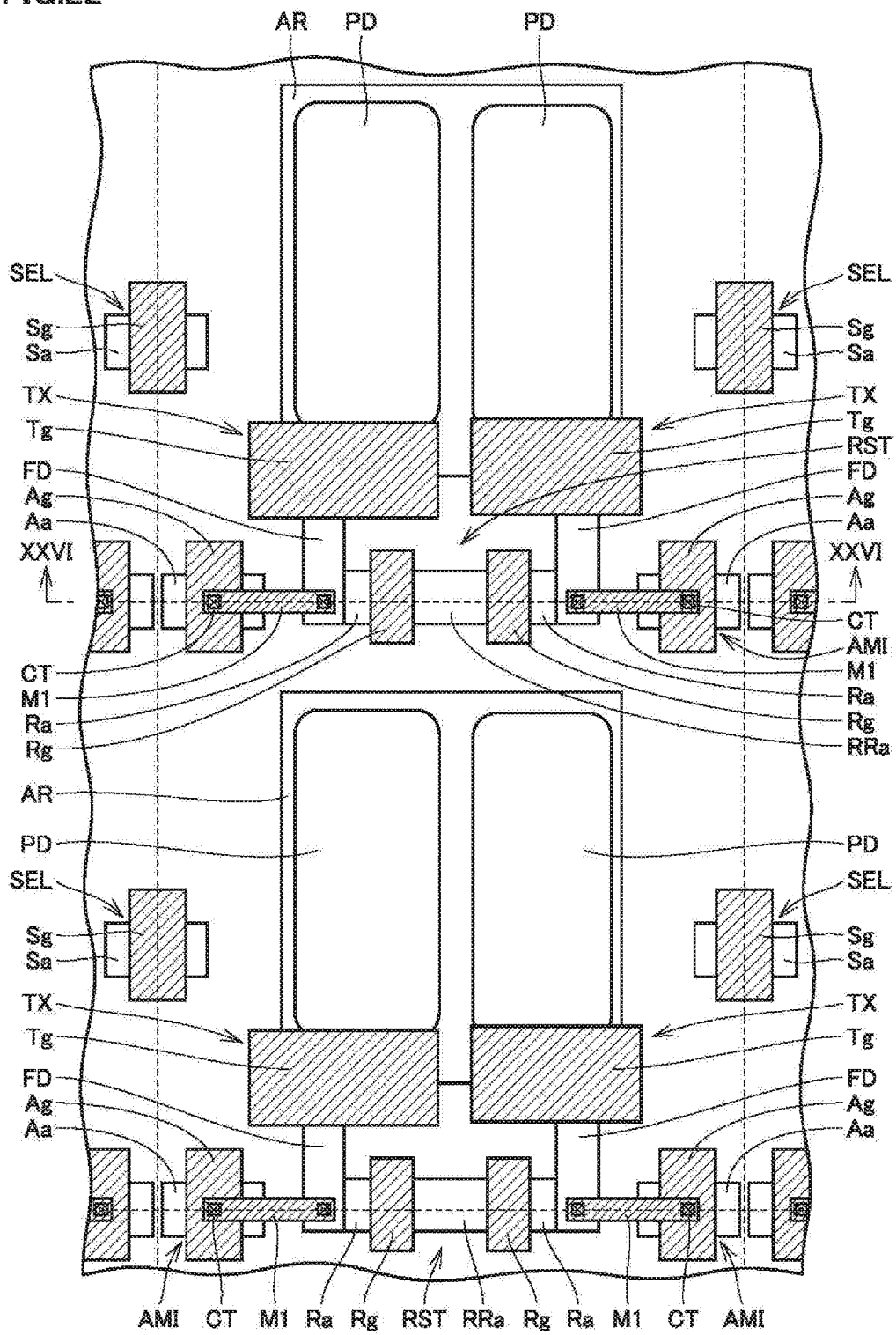
FIG. 22 is an enlarged schematic plan view of a region XXII surrounded by a dotted line in FIG. 21.

Referring to FIGS. 21 and 22, a semiconductor device in a first example of the present embodiment has a so-called parallel-type configuration, basically as in the first example of the first embodiment in FIGS. 3 and 4. However, in the present embodiment, two reset transistors RST as a first transistor are arranged between floating diffusion regions FD of one and the other of two transfer transistors TX within each pixel region which are aligned in the right/left direction in a plan view. In addition, two reset transistors RST are arranged to be connected to (floating diffusion regions FD of) two transfer transistors TX, respectively, within each pixel region.

Reset active regions Ra of one and the other of two reset transistors RST within each pixel region partially overlap in a region RRa, and reset active regions Ra are arranged to be aligned on a straight line. However, such arrangement is one example, and the semiconductor device does not necessarily have such a configuration.

In the above regard, the present embodiment is different in configuration from the first embodiment in which one amplification transistor AMI as the first transistor is arranged between floating diffusion regions FD of one and the other of two transfer transistors TX within each pixel region.

In particular, in FIGS. 21 and 22, each of two floating diffusion regions FD and two reset transistors RST as the first transistor therebetween are arranged to be aligned in a straight line in the right/left direction of the drawing in a plan view. One amplification transistor AMI is arranged on each of extension lines (on the right and left sides of FIGS. 21 and 22) of the straight line which connects two floating diffusion regions FD and two reset transistors RST therebetween in a plan view (i.e., two amplification transistors AMI are arranged for each pixel region). In other words, two amplification transistors AMI are aligned with each of two floating diffusion regions FD on the straight line in a plan view. In addition, each of two floating diffusion regions FD described above and each of reset active regions Ra, for example, of two reset transistors RST therebetween are connected to overlap in a plan view. Further, each of two floating diffusion regions FD described above and amplification gate electrode Ag, for example, of amplification transistor AMI adjacent thereto are electrically connected to wire M1 extending like a straight line in the right/left direction of the drawing, through contacts CT, for example.

For example, in FIG. 22, two separate wires M1 are arranged. However, all of amplification gate electrode Ag on the left side, two floating diffusion regions FD, and amplification gate electrode Ag on the right side of FIGS. 21 and 22 may be connected by one straight wire M1.

Namely, in the present embodiment, one reset transistor RST and one amplification transistor AMI are assigned to each of two transfer transistors TX within one pixel region. Further, in the present embodiment, two selection transistors SEL are arranged within one pixel region as shown in FIGS.

21 and 22. Although selection gate electrodes Sg are arranged here to extend in the up/down direction of the drawing as in FIG. 3 and the like, this arrangement is one example, and the arrangement is not limited thereto.

It should be noted that, also in the present embodiment, a pair of reset transistors RST as the first transistor in each pixel region are arranged, within the pixel region, between one transfer gate electrode Tg and the other transfer gate electrode Tg of two transfer gate electrodes Tg with respect to the right/left direction of the drawing in which one transfer gate electrode Tg and the other transfer gate electrode Tg are aligned, as in the first embodiment. Further, also in the present embodiment, a pair of reset transistors RST as the first transistor in each pixel region are arranged, within the pixel region, between one photodiode PD and the other photodiode PD of two photodiodes PD with respect to the right/left direction of the drawing in which one photodiode PD and the other photodiode PD are aligned, as in the first embodiment.

Figure 23:
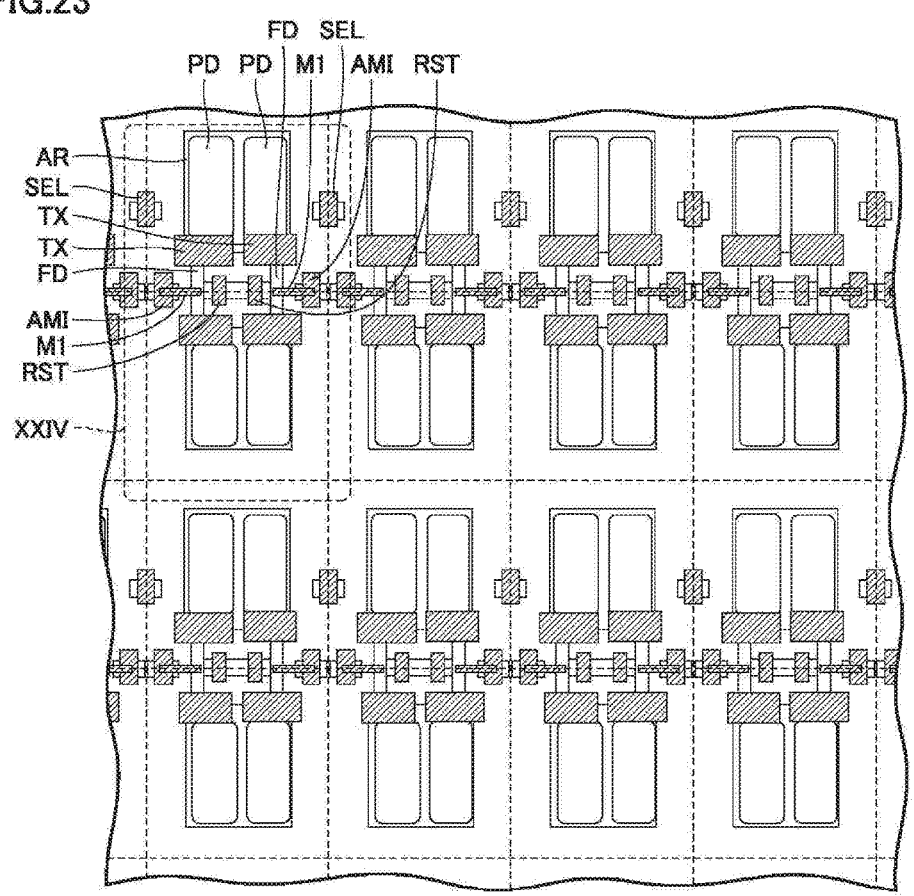
FIG. 23 is a schematic plan view showing a second example of the configuration of the pixel portion of the semiconductor device in the third embodiment.
Figure 24:
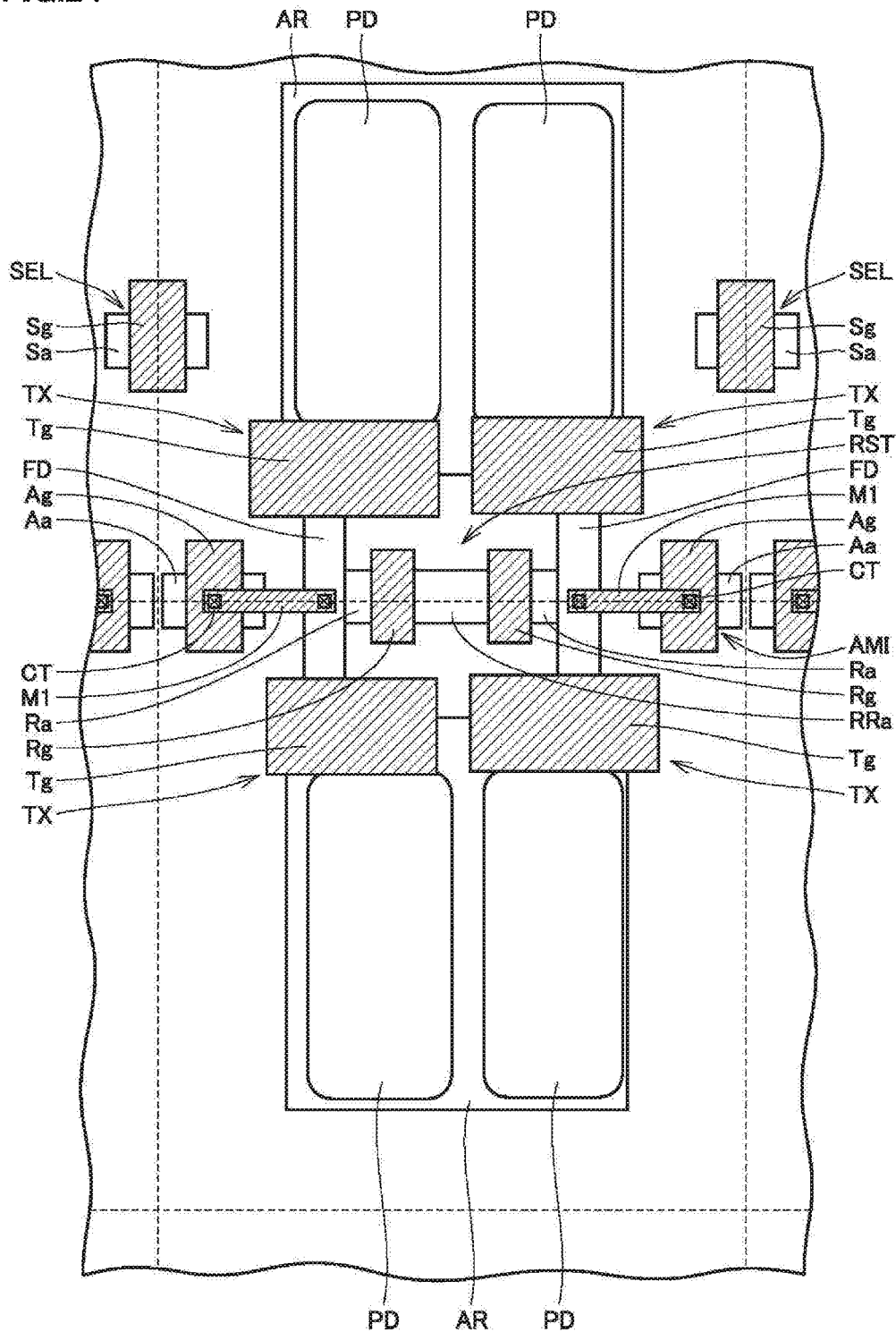
FIG. 24 is an enlarged schematic plan view of a region XXIV surrounded by a dotted line in FIG. 23.

Referring to FIGS. 23 and 24, in a second example of the present embodiment, the same configuration as that in FIGS. 21 and 22 is applied to a so-called facing-type configuration as in the second example of the first embodiment in FIGS. 5 and 6. The configuration in FIGS. 23 and 24 is basically the same as the configuration in FIGS. 21 and 22, except that the configuration is changed from a parallel-type configuration to a facing-type configuration, and that amplification transistor AMI and reset transistor RST are shared between transfer transistors TX in two pixel regions adjacent to each other in the up/down direction of the drawing. Therefore, identical elements will be designated by the same reference numerals, and the description thereof will not be repeated.

Figure 25:
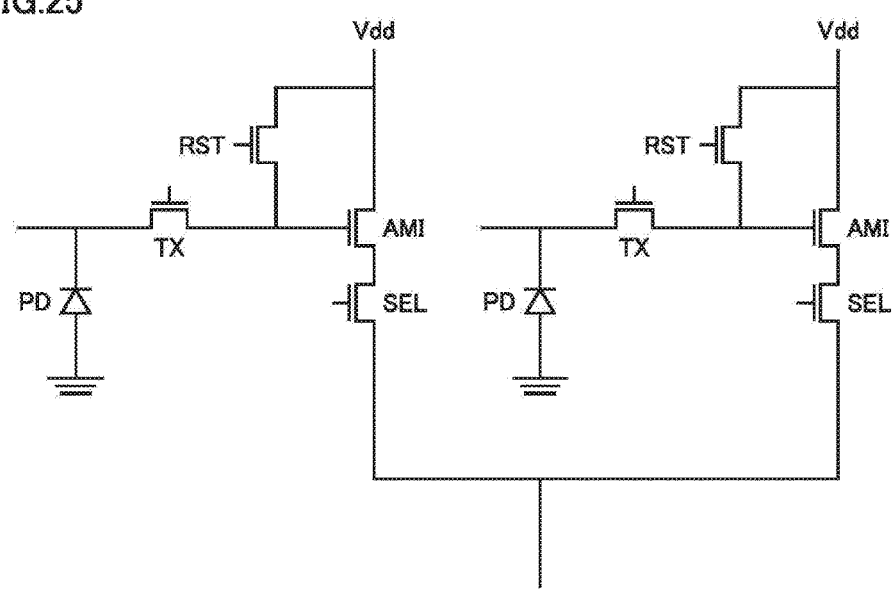
FIG. 25 is a circuit diagram showing the configuration of the pixel portion in the third embodiment.

Referring to FIG. 25, both the first example in FIGS. 21 and 22 and the second example in FIGS. 23 and 24 have a substantially identical configuration when represented in a circuit diagram. However, as described above, FIG. 25 is different from FIG. 7 in that one reset transistor RST, one amplification transistor AMI, and one selection transistor SEL are assigned to one transfer transistor TX.

Figure 26:
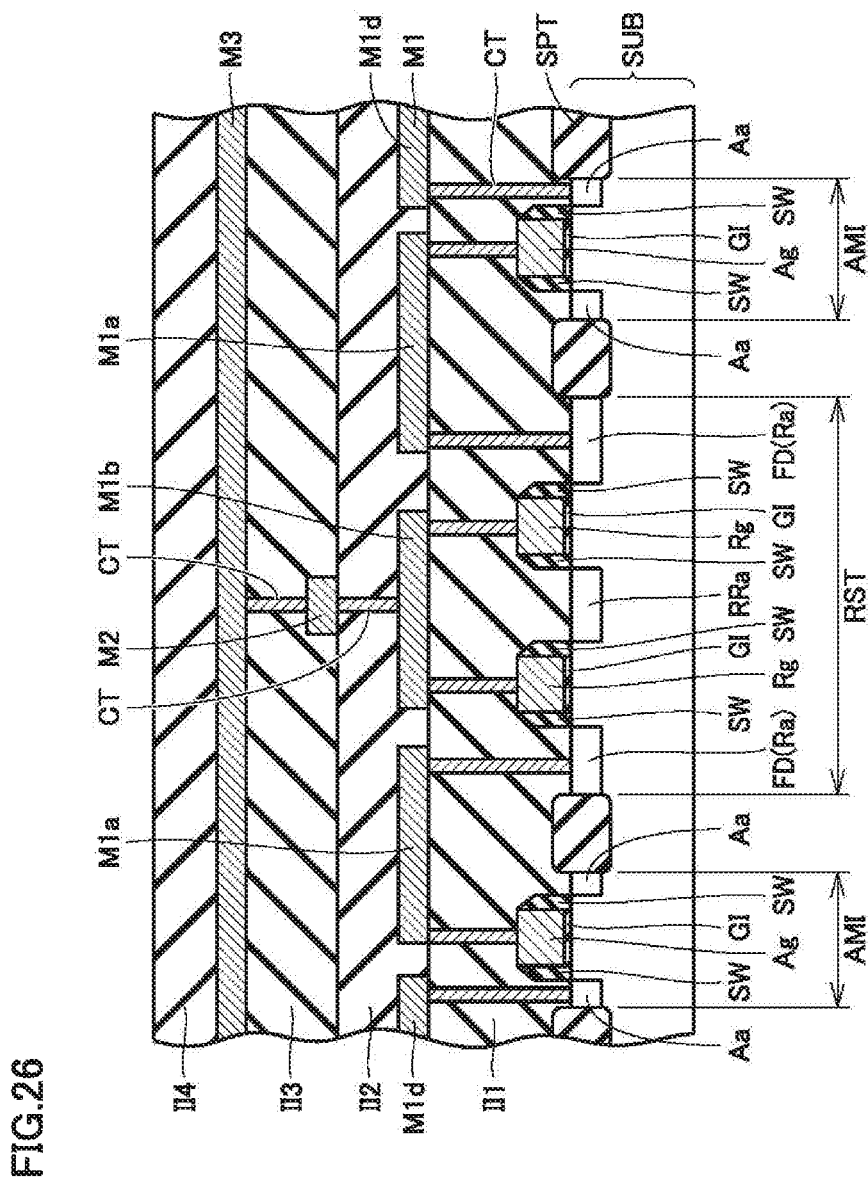
FIG. 26 is a schematic cross sectional view of a portion taken along a line XXVI-XXVI in FIG. 22.

Referring to FIG. 26, in the configuration of this schematic cross sectional view, two reset transistors RST are arranged between two floating diffusion regions FD (reset active regions Ra may be arranged to planarly overlap with portions of two floating diffusion regions FD), and two amplification transistors AMI are arranged on the outside of two floating diffusion regions FD. Further, as wire M1, in addition to wires M1a and M1b, wires M1d extending toward selection transistors SEL on the further outside of amplification transistors AMI are arranged. It should be noted that the cross sectional view in the present embodiment with respect to the same direction as that in the cross sectional view of FIG. 8(A) is omitted because it is the same as that of FIG. 8(A).

Other than the above exception, the configuration of the present embodiment is substantially the same as the configuration of the first embodiment, and thus identical elements will be designated by the same reference numerals, and the description thereof will not be repeated.

Next, the function and effect of the present embodiment will be described.

As in the present embodiment, the first transistor sandwiched between two floating diffusion regions FD (transfer gate electrodes Tg, photodiodes PD) with respect to the right/left direction of the drawing may be reset transistors RST. Further, since one reset transistor RST is assigned for each transfer transistor TX, transmission of an electric signal from each of two transfer transistors TX (photodiodes PD) to reset transistor RST within one pixel region can be performed at favorable timing. Namely, for example, electric signals from one and the other of two transfer transistors TX within one pixel region can be transmitted to reset transistors RST at the same timing.

Therefore, in the present embodiment, transmission of electric signals can be processed quickly, when compared with the first embodiment and the like in which, for example, two transfer transistors TX share one reset transistor RST and thus two transfer transistors TX should transmit electric signals to reset transistor RST at different timings.

(Fourth Embodiment)

Figure 27:
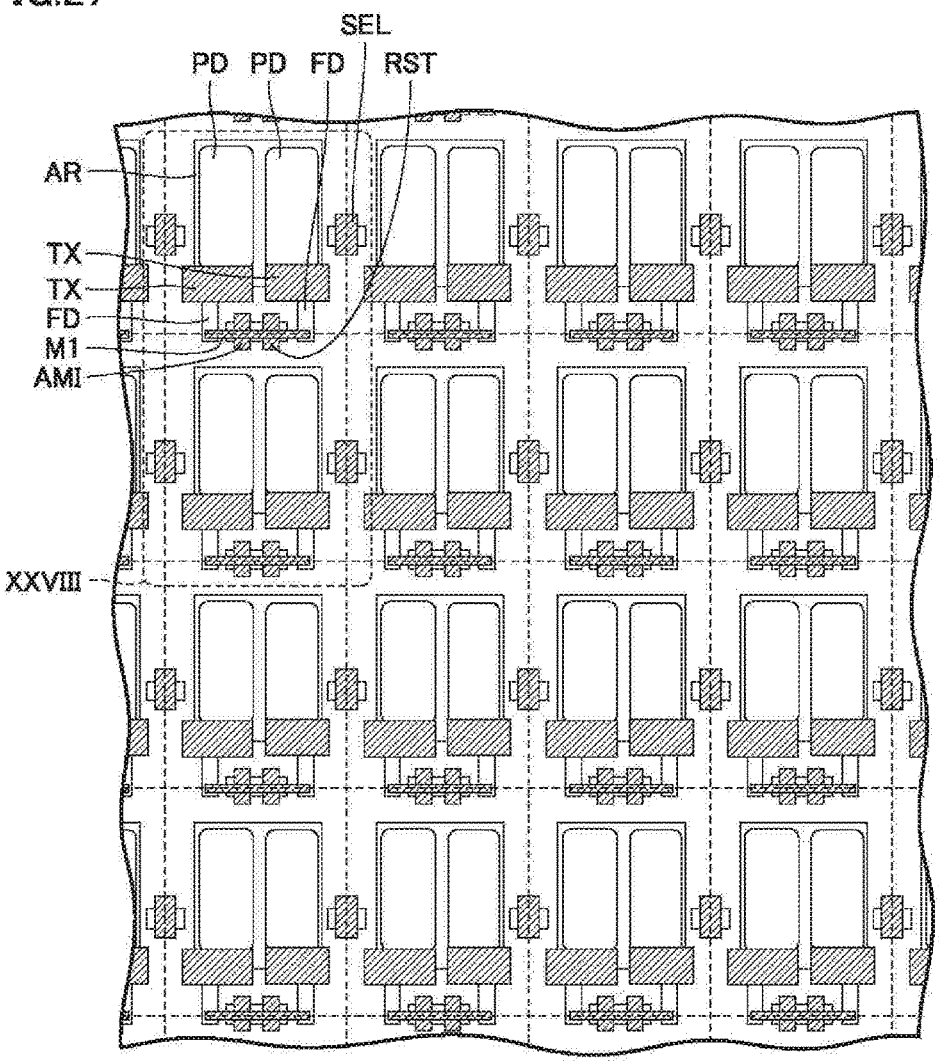
FIG. 27 is a schematic plan view showing a first example of a configuration of a pixel portion of a semiconductor device in a fourth embodiment.
Figure 28:
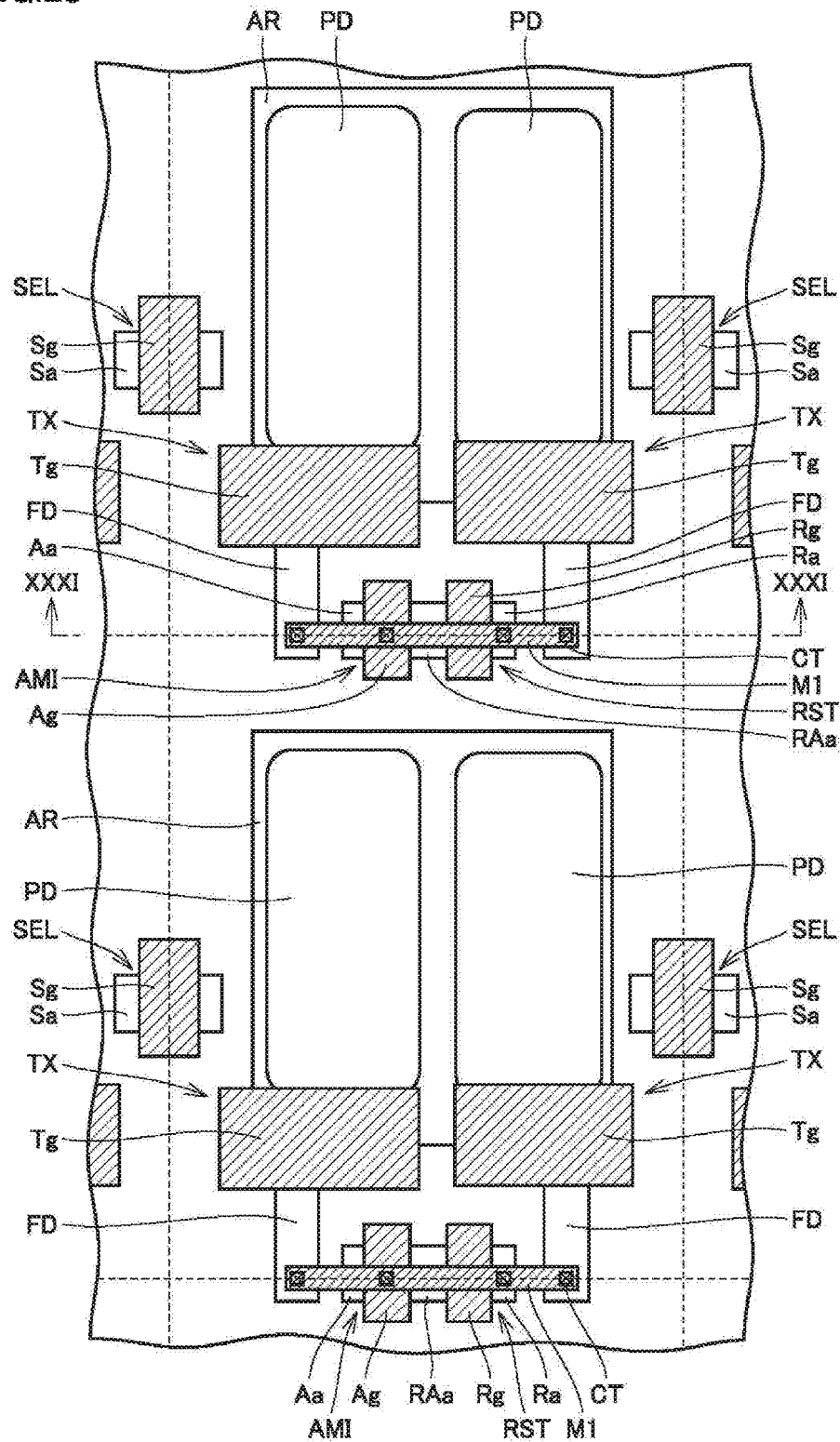
FIG. 28 is an enlarged schematic plan view of a region XXVIII surrounded by a dotted line in FIG. 27.

Referring to FIGS. 27 and 28, a semiconductor device in a first example of the present embodiment has a so-called parallel-type configuration, basically as in the first example of the first embodiment in FIGS. 3 and 4. However, in the present embodiment, both one amplification transistor AMI and one reset transistor RST as a first transistor are arranged between floating diffusion regions FD of one and the other of two transfer transistors TX within each pixel region which are aligned in the right/left direction in a plan view. In addition, amplification transistor AMI and reset transistor RST are arranged to be connected to (floating diffusion regions FD of) two transfer transistors TX, respectively, within each pixel region. In this regard, the present embodiment is different in configuration from the first to third embodiments in which either amplification transistor AMI or reset transistors RST as the first transistor are arranged between floating diffusion regions FD of one and the other of two transfer transistors TX within each pixel region.

In particular, in FIGS. 27 and 28, each of two floating diffusion regions FD and amplification transistor AMI and reset transistor RST as the first transistor therebetween are arranged to be aligned in a straight line in the right/left direction of the drawing in a plan view. Further, each of two floating diffusion regions FD described above, and amplification gate electrode Ag of amplification transistor AMI and reset active region Ra of reset transistor RST adjacent thereto are electrically connected to wire M1 extending like a straight line in the right/left direction of the drawing, through contacts CT, for example.

Although amplification active region Aa of amplification transistor AMI and reset active region Ra of reset transistor RST between two floating diffusion regions FD partially overlap (in a region RAa), this is one example, and the semiconductor device does not necessarily have such a configuration.

As described above, in the present embodiment, one reset transistor RST and one amplification transistor AMI are arranged for each pixel region, as in the first embodiment.

It should be noted that selection transistor SEL may be arranged on an extension line of a straight line which connects amplification transistor AMI, reset transistor RST, and the like, or may be arranged in a region different from the extension line of the straight line. Further, one selection transistor SEL or two selection transistors SEL may be arranged within one pixel region.

It should be noted that, also in the present embodiment, amplification transistor AMI and reset transistor RST as the first transistor in each pixel region are arranged, within the pixel region, between one transfer gate electrode Tg and the other transfer gate electrode Tg of two transfer gate electrodes Tg with respect to the right/left direction of the drawing in which one and the other transfer gate electrodes Tg are aligned, as in the first embodiment. Further, also in the present embodiment, amplification transistor AMI and reset transistor RST as the first transistor in each pixel region are arranged, within the pixel region, between one photodiode PD and the other photodiode PD of two photodiodes PD with respect to the right/left direction of the drawing in which one and the other photodiodes PD are aligned, as in the first embodiment.

Figure 29:
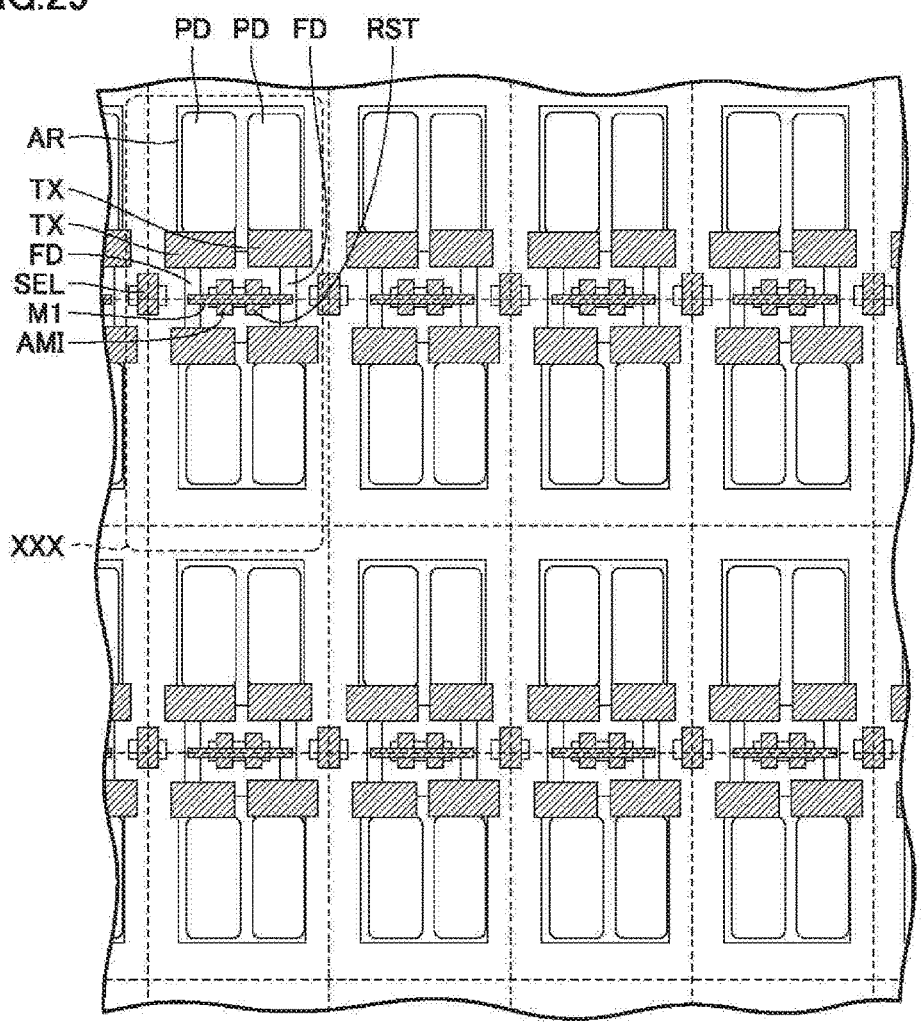
FIG. 29 is a schematic plan view showing a second example of the configuration of the pixel portion of the semiconductor device in the fourth embodiment.
Figure 30:
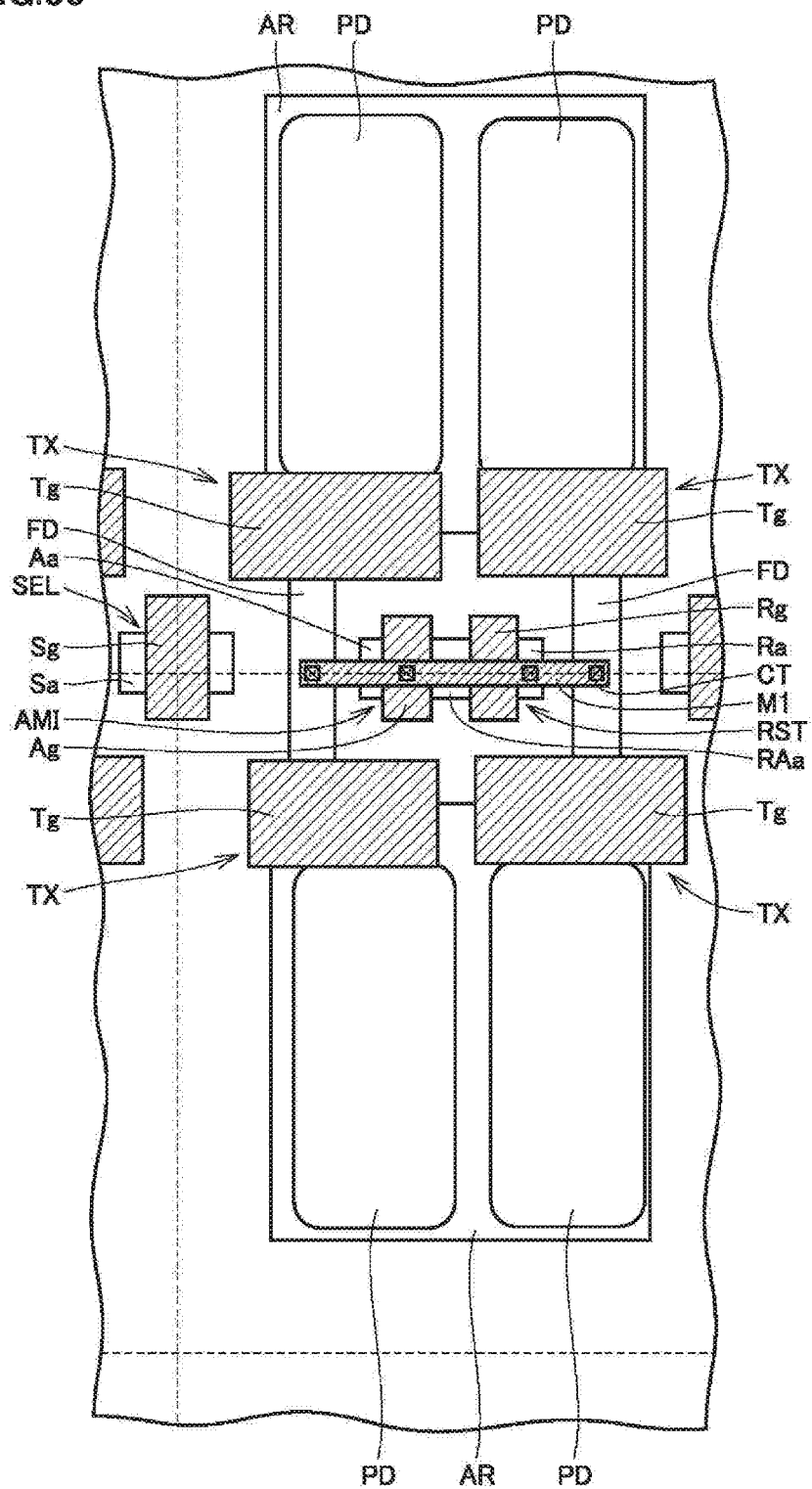
FIG. 30 is an enlarged schematic plan view of a region XXX surrounded by a dotted line in FIG. 29.

Referring to FIGS. 29 and 30, in a second example of the present embodiment, the same configuration as that in FIGS. 27 and 28 is applied to a so-called facing-type configuration as in the second example of the first embodiment in FIGS. 5 and 6. The configuration in FIGS. 29 and 30 is basically the same as the configuration in FIGS. 27 and 28, except that the configuration is changed from a parallel-type configuration to a facing-type configuration, and that amplification transistor AMI and reset transistor RST are shared between transfer transistors TX in two pixel regions adjacent to each other in the up/down direction of the drawing. Therefore, identical elements will be designated by the same reference numerals, and the description thereof will not be repeated.

Figure 31:
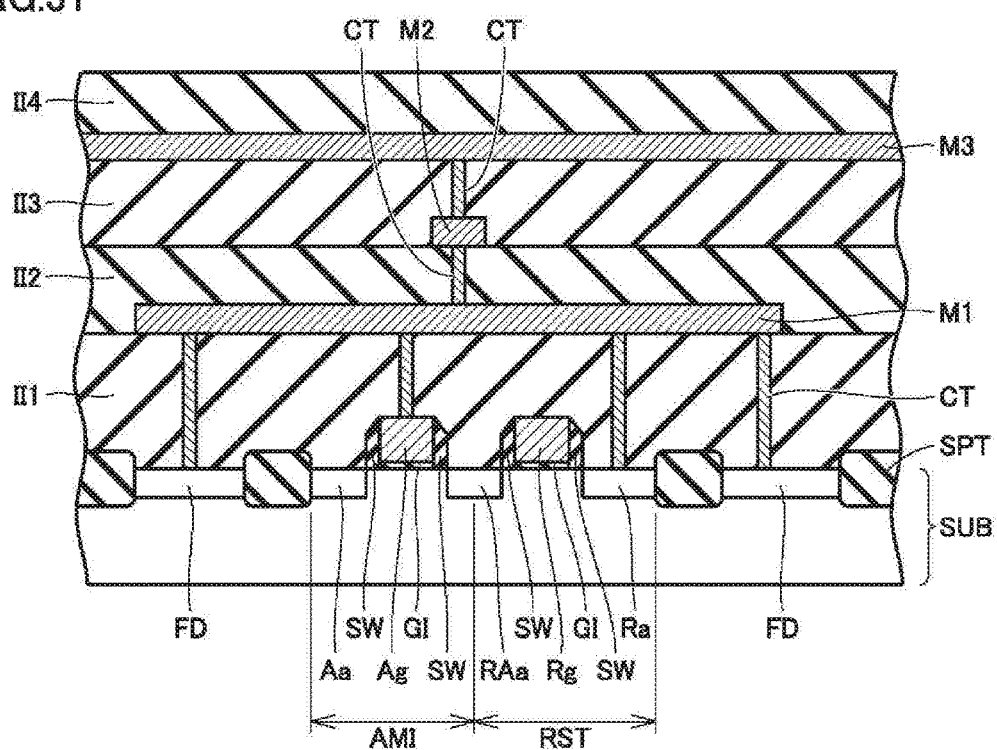
FIG. 31 is a schematic cross sectional view of a portion taken along a line XXXI-XXXI in FIG. 28.

Referring to FIG. 31, the configuration of this schematic cross sectional view has basically the same configuration as that of the first embodiment in FIG. 8(B), except that amplification transistor AMI and reset transistor RST are arranged between two floating diffusion regions FD, and that amplification gate electrode Ag, reset active region Ra, and floating diffusion regions FD are connected to wire M1 through contacts CT. It should be noted that the cross sectional view in the present embodiment with respect to the same direction as that in the cross sectional view of FIG. 8(A) is omitted because it is the same as that of FIG. 8(A). In addition, the circuit diagram of the configuration of the present embodiment is omitted because it is the same as that of FIG. 7.

It should be noted that, although reset transistor RST and amplification transistor AMI are described above as the first transistor arranged between two floating diffusion regions FD, selection transistor SEL may be arranged as the first transistor.

Other than the above exception, the configuration of the present embodiment is substantially the same as the configuration of the first embodiment, and thus identical elements will be designated by the same reference numerals, and the description thereof will not be repeated.

Next, the function and effect of the present embodiment will be described.

In the present embodiment, both amplification transistor AMI and reset transistor RST are arranged between two floating diffusion regions FD (transfer gate electrodes Tg, photodiodes PD), and amplification transistor AMI and the like are not arranged on the outside of two floating diffusion regions FD. Therefore, wire M1 which connects the first transistor and each floating diffusion region can have a further shortened length, when compared with the first embodiment and the like in which at least one of amplification transistor AMI and reset transistor RST is arranged on the outside of two floating diffusion regions FD. Therefore, wire capacitance due to wire M1 can be further reduced.

(Fifth Embodiment)

In any of the embodiments described above, transfer transistor TX has a configuration in which photodiode PD, transfer gate electrode Tg, and floating diffusion region FD are arranged to be aligned on a straight line (in the up/down direction of each plan view). However, referring to FIG. 32, transfer transistor TX may be configured to have floating diffusion region FD in a direction inclined relative to a direction in which a straight line which connects photodiode PD and transfer gate electrode Tg extends, in a plan view.

Further, in any of the embodiments described above, amplification transistor AMI or the like as the first transistor is arranged on a straight line which connects two floating diffusion regions FD within each pixel region. However, referring to FIG. 32, amplification transistor AMI, for example, as the first transistor may be arranged in a region deviated from a straight line formed by connecting two floating diffusion regions FD within each pixel region. In FIG. 32, amplification transistor AMI within the pixel region is arranged slightly lower than the straight line formed by connecting two floating diffusion regions FD. Further, although portions of transfer gate electrodes Tg may be arranged on the straight line formed by connecting two floating diffusion regions FD as shown in FIG. 32, transfer gate electrodes Tg may be arranged in the region deviated from the straight line.

For example, the first transistor arranged within the first pixel region which is one of the plurality of pixel regions is preferably arranged between active region AR (in which photodiodes PD are built) in the first pixel region and active region AR in the second pixel region adjacent to a side of the first pixel region provided with two floating diffusion regions FD (i.e., the lower side in FIG. 32 and each of other embodiments) when seen from active region AR in the first pixel region. In other words, in FIG. 32, amplification transistor AMI corresponding to the first transistor is preferably arranged at least between upper active region AR (in the first pixel region) and lower active region AR (in the second pixel region).

It should be noted that, although amplification transistor AMI is shown as the first transistor in FIG. 32, reset transistors RST may be arranged, or both amplification transistor AMI and reset transistor RST may be arranged, as the first transistor, as described in the embodiments described above.

Further, although reset transistor RST is arranged as the second transistor in FIG. 32 in the region deviated from the straight line which connects two floating diffusion regions FD (i.e., below the straight line), amplification transistor AMI, for example, may also be arranged as the second transistor.

Furthermore, the position where the second transistor is arranged and the directions (in which the gate electrodes extend) are not limited to those shown in FIG. 32. For example, although transfer gate electrodes Tg extend in the up/down direction of the drawing and amplification gate electrode Ag and reset gate electrode Rg extend in the right/left direction of the drawing in FIG. 32, amplification gate electrode Ag and reset gate electrode Rg may also extend in the up/down direction of the drawing, for example.

Other than the above exception, the configuration of the present embodiment is substantially the same as the configuration of the first embodiment, and thus identical elements will be designated by the same reference numerals, and the description thereof will not be repeated.

Next, the function and effect of the present embodiment will be described. Even if the first transistor is not necessarily arranged on the straight line which connects a pair of floating diffusion regions FD, as long as the first transistor is at least arranged in a region between a pair of active regions AR adjacent to each other as in the present embodiment, this arrangement can suppress a defect that wire M1 routed from floating diffusion regions FD to the first transistor has an excessively long length (for example, as in the comparative example in FIG. 15). Therefore, wire capacitance can be reduced.

Further, by permitting the present embodiment, the applicable range of the layout of transistors constituting a semiconductor device can be extended, and the degree of freedom of design is increased.

Although the invention made by the present inventor has been specifically described based on the embodiments, it is needless to say that the present invention is not limited to the embodiments described above, and can be modified in various manners in a range not departing from its gist.

REFERENCE SIGNS LIST

Aa: amplification active region; Ag: amplification gate electrode; AMI: amplification transistor; AR: active region; CT: contact; DLR: dicing line region; FD: floating diffusion region; FLT: color filter; GI: gate insulating film; II1, II2, II3, II4: interlayer insulating film; IMC: chip region; LNS: lens; M1, M2, M3: wire; NR: n type region; PD: photodiode; Ra: reset active region; Rg: reset gate electrode; RST: reset transistor; Sa: selection active region; SCW: semiconductor wafer; SEL: selection transistor; Sg: selection gate electrode; SPR: surface p type region; SPT: element separation film; SUB: semiconductor substrate; Tg: transfer gate electrode; TX: transfer transistor.

The invention claimed is:

1. A semiconductor device including a plurality of pixel regions aligned in a matrix in a semiconductor substrate,
   each of the plurality of pixel regions including:
   one active region formed in the semiconductor substrate;
   two photoelectric conversion elements arranged within the one active region to be spaced from each other;
   two floating capacitance regions each of which being configured to constitute a transfer transistor for transferring electrons obtained by photoelectric conversion, together with each of the two photoelectric conversion elements, and takes out and accumulates an electric signal output from the photoelectric conversion element; and
   a first transistor which receives an electric signal output from the transfer transistor,
   each of the plurality of pixel regions including two transfer transistors each including said each of the two photoelectric conversion elements and each of the two floating capacitance regions,
   the first transistor being arranged within a pixel region of the pixel regions, between one floating capacitance region and an other floating capacitance region of the two floating capacitance regions with respect to a direction in which the one floating capacitance region and the other floating capacitance region are aligned, and
   the first transistor being arranged within the pixel region between one photoelectric conversion element and an other photoelectric conversion element of the two photoelectric conversion elements with respect to a direction in which the one photoelectric conversion element and the other photoelectric conversion element are aligned.

2. The semiconductor device according to claim 1, wherein said each of the two floating capacitance regions and the first transistor are aligned on a straight line in a plan view.

3. The semiconductor device according to claim 1, wherein the first transistor is arranged between the active region in a first pixel region and the active region in a second pixel region of the plurality of pixel regions, the first pixel region including the first transistor arranged therein, the second pixel region being adjacent to a side of the first pixel region provided with the one and the other floating capacitance regions when seen from the active region in the first pixel region.

4. The semiconductor device according to claim 3, wherein the one and the other floating capacitance regions are shared by the first pixel region and the second pixel region.

5. The semiconductor device according to claim 1, wherein the first transistor includes an amplification transistor which amplifies the electric signals from the two transfer transistors, and
   wherein the amplification transistor is shared by the two transfer transistors.

6. The semiconductor device according to claim 5, wherein each of the plurality of pixel regions further includes a second transistor which receives an electric signal output from the first transistor, and
   wherein said each of the two floating capacitance regions and the second transistor are aligned on a straight line in a plan view.

7. The semiconductor device according to claim 6, wherein the second transistor includes a source region and a drain region, and
   wherein at least a portion of any of the source region and the drain region overlaps with any of the two floating capacitance regions.

8. The semiconductor device according to claim 7, wherein the first transistor includes a first gate electrode,
   wherein the second transistor includes a second gate electrode, and
   wherein the first gate electrode and the second gate electrode extend in directions intersecting with each other in a plan view.

9. The semiconductor device according to claim 1, wherein the first transistor includes a reset transistor which resets the electric signal accumulated in the transfer transistor, and
   wherein the reset transistor is arranged to be connected to the transfer transistor.

10. The semiconductor device according to claim 1, wherein the first transistor includes both an amplification transistor which amplifies the electric signals from the two transfer transistors, and a reset transistor which resets the electric signals accumulated in the transfer transistors.

11. The semiconductor device according to claim 1, wherein each of the two transfer transistors includes a transfer gate electrode, and
   wherein the first transistor is arranged within the pixel region, between one transfer gate electrode and an other transfer gate electrode of two transfer gate electrodes with respect to a direction in which the one transfer gate electrode and the other transfer gate electrode are aligned.

12. The semiconductor device according to claim 11, wherein the first transistor includes an amplification transistor which amplifies the electric signals from the two transfer transistors, and
   wherein one amplification transistor is shared by the two transfer transistors.

13. The semiconductor device according to claim 12, wherein each of the plurality of pixel regions further includes a second transistor which receives an electric signal output from the first transistor, and wherein said each of the two floating capacitance regions and the second transistor are aligned on a straight line in a plan view.

14. The semiconductor device according to claim 11, wherein the first transistor includes a reset transistor which resets the electric signal accumulated in the transfer transistor, and
wherein the reset transistor is arranged to be connected to the transfer transistor.

15. The semiconductor device according to claim 11, wherein the first transistor includes both an amplification transistor which amplifies the electric signals from the two transfer transistors, and a reset transistor which resets the electric signals accumulated in the transfer transistors.

16. The semiconductor device according to claim 1, wherein the first transistor includes an amplification transistor which amplifies the electric signals from the two transfer transistors, and
wherein one amplification transistor is shared by the two transfer transistors.

17. The semiconductor device according to claim 16, wherein each of the plurality of pixel regions further includes a second transistor which receives an electric signal output from the first transistor, and
wherein said each of the two floating capacitance regions and the second transistor are aligned on a straight line in a plan view.

18. The semiconductor device according to claim 1, wherein the first transistor includes a reset transistor which resets the electric signal accumulated in the transfer transistor, and
wherein the reset transistor is arranged to be connected to the transfer transistor.

19. The semiconductor device according to claim 1, wherein the first transistor includes both an amplification transistor which amplifies the electric signals from the two transfer transistors, and a reset transistor which resets the electric signals accumulated in the transfer transistors.

* * * * *